(12) United States Patent
Flachowsky et al.

(10) Patent No.: US 9,012,277 B2
(45) Date of Patent: Apr. 21, 2015

(54) IN SITU DOPING AND DIFFUSIONLESS ANNEALING OF EMBEDDED STRESSOR REGIONS IN PMOS AND NMOS DEVICES

(75) Inventors: Stefan Flachowsky, Dresden (DE); Ralf Illgen, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 168 days.

(21) Appl. No.: 13/346,043

(22) Filed: Jan. 9, 2012

(65) Prior Publication Data

US 2013/0178024 A1   Jul. 11, 2013

(51) Int. Cl.
| | |
|---|---|
| *H01L 21/70* | (2006.01) |
| *H01L 21/8238* | (2006.01) |
| *H01L 21/36* | (2006.01) |
| *H01L 21/268* | (2006.01) |
| *H01L 29/49* | (2006.01) |
| *H01L 29/51* | (2006.01) |
| *H01L 29/66* | (2006.01) |

(52) U.S. Cl.
CPC *H01L 21/823807* (2013.01); *H01L 21/823814* (2013.01); *H01L 21/268* (2013.01); *H01L 21/2686* (2013.01); *H01L 29/4966* (2013.01); *H01L 29/517* (2013.01); *H01L 29/66545* (2013.01)

(58) Field of Classification Search
CPC .............. H01L 21/823807; H01L 21/823814; H01L 21/823412; H01L 21/823418; H01L 21/02532; H01L 21/268; H01L 21/2686; H01L 29/0653; H01L 29/517; H01L 29/4966; H01L 29/66545; H01L 29/7848; H01L 29/6653; H01L 29/66636; H01L 29/165; H01L 29/7834; H01L 29/784; H01L 27/088

USPC .......... 438/199, 229, 478; 257/368, E21.632, 257/190, 192, E21.102, E27.06, E21.633, 257/E21.634, E27.062, E29.246
See application file for complete search history.

(56) References Cited

U.S. PATENT DOCUMENTS

| | | | | |
|---|---|---|---|---|
| 8,647,953 | B2 * | 2/2014 | Liao et al. | 438/300 |
| 8,754,448 | B2 * | 6/2014 | Liao et al. | 257/192 |
| 2005/0158931 | A1 * | 7/2005 | Chen et al. | 438/191 |
| 2007/0099404 | A1 * | 5/2007 | Govindaraju et al. | 438/520 |
| 2010/0025771 | A1 * | 2/2010 | Hoentschel et al. | 257/369 |

(Continued)

OTHER PUBLICATIONS

Ramachandran et al., "Solutions for Ultra Shallow Junctions—Improvements in spike anneal," Transistor Capacitor Group, Santa Clara, CA.
Li et al., "Superior Spike Annealing Performance in 65nm Source/Drain Extension Engineering," 13th IEEE International Conference on Advanced Thermal Processing of Semiconductors, pp. 163-167, 2005.

(Continued)

*Primary Examiner* — Wensing Kuo
*Assistant Examiner* — Moazzam Hossain
(74) *Attorney, Agent, or Firm* — Amerson Law Firm, PLLC

(57) ABSTRACT

Generally, the present disclosure is directed to methods for forming dual embedded stressor regions in semiconductor devices such as transistor elements and the like, using in situ doping and substantially diffusionless annealing techniques. One illustrative method disclosed herein includes forming first and second cavities in PMOS and NMOS device regions, respectively, of a semiconductor substrate, and thereafter performing first and second epitaxial deposition processes to form in situ doped first and second embedded material regions in the first and second cavities, respectively. The method further includes, among other things, performing a single heat treating process to activate dopants in the in situ doped first and second embedded material regions.

27 Claims, 14 Drawing Sheets

(56) References Cited

U.S. PATENT DOCUMENTS

| | | | |
|---|---|---|---|
| 2010/0164005 A1* | 7/2010 | Yu et al. | 257/369 |
| 2010/0193882 A1* | 8/2010 | Hoentschel et al. | 257/410 |
| 2010/0224937 A1* | 9/2010 | Sridhar | 257/369 |
| 2011/0068396 A1* | 3/2011 | Cheng et al. | 257/335 |
| 2013/0001706 A1* | 1/2013 | Haran et al. | 257/410 |
| 2013/0105861 A1* | 5/2013 | Liao et al. | 257/192 |

OTHER PUBLICATIONS

"Optimizing gate dielectrics using laser-spike annealing," ElectroIQ—The Portal for Electronics Manufacturing.

"Laser spike annealing operates nearly instantaneously at 1350 degrees C," Ultratech Inc., Oct. 24, 2011.

U.S. Appl. No. 13/190,940, filed Jul. 26, 2011.

U.S. Appl. No. 13/232,571, filed Sep. 14, 2011.

* cited by examiner

IN SITU DOPING AND DIFFUSIONLESS ANNEALING OF EMBEDDED STRESSOR REGIONS IN PMOS AND NMOS DEVICES

BACKGROUND OF THE INVENTION

1. Field of the Invention

Generally, the present invention relates to sophisticated integrated circuits, and, more particularly, to using in situ doping and substantially diffusionless annealing for forming embedded stressor regions to enhance the performance of semiconductor devices such as transistor elements and the like.

2. Description of the Related Art

In modern ultra-high density integrated circuits, device features have been steadily decreasing in size to enhance the performance of the semiconductor device and the overall functionality of the circuit. In addition to an increase in the speed of operation due to reduced signal propagation times, reduced feature sizes allow an increase in the number of functional elements in the circuit in order to extend its functionality. Today, advanced semiconductor devices may include features having a critical size of 32 nm or even less.

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption. During the fabrication of complex integrated circuits using CMOS technology, millions of complementary transistors, i.e., N-channel (NMOS) transistors and P-channel (PMOS) transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region. The conductivity of the channel region, i.e., the drive current capability of the conductive channel, is controlled by a gate electrode formed above the channel region and separated from the channel by a thin gate insulating layer, or gate dielectric. In operation, an appropriate control voltage is applied to the gate electrode, which thereby forms a conductive channel below the gate electrode. The conductivity of the channel region depends on several factors, including dopant concentration, the mobility of the charge carriers and, for a given extension of the channel region in the transistor width direction, on the distance between the source and drain regions, which is also referred to as channel length. Therefore, in combination with the capability of rapidly creating a conductive channel below the insulating layer upon application of the control voltage to the gate electrode, the conductivity of the channel region substantially determines the performance of the MOS transistors. Thus, the reduction of the channel length, and the commensurate reduction of the channel resistivity, renders the channel length a dominant design criteria for accomplishing an increase in the operating speed of the integrated circuits.

The continuous shrinkage of the transistor dimensions, however, carries with it a plurality of issues which have to be addressed so as to not unduly offset the advantages that may be obtained by steadily decreasing the channel length of MOS transistors, such as the development of enhanced photolithography and etch strategies necessary to reliably and reproducibly create circuit elements having very small critical dimensions for new device generations. Given the general processing difficulties associated with the continuous size reduction of the critical dimensions, i.e., the gate length of the transistors, other mechanisms have been utilized in an effort to increase charge carrier mobility in the channel region of transistor elements and thereby enhance overall device performance. For example, in one approach, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach unless other mechanisms are developed to adjust a desired threshold voltage. In another approach, the lattice structure in the channel region may be modified, for instance by creating tensile or compressive stress, which results in a modified mobility for electrons and holes. For example, creating a tensile stress in the channel region increases the mobility of electrons, wherein, depending on the magnitude of the tensile stress, an increase in mobility of up to 20% may be obtained, which, in turn, may directly translate into an increased channel conductivity and a corresponding improvement in NMOS transistor performance. On the other hand, a compressive stress in the channel region may increase the mobility of holes, thereby providing the potential for enhancing the performance of PMOS transistors.

One common approach for inducing a desired level of stress in the channel region of some semiconductor devices is through the use of stressed overlayers. In practice, a stressed overlayer—i.e., a material layer having an intrinsic internal stress—is formed above the transistor elements, and the intrinsic stress of the stressed overlayer is transferred through the gate electrode and any sidewall spacer elements to the channel region below the gate dielectric layer. The stressed overlayer method, however, has some inherent drawbacks. For example, once formed, the stressed overlayer must typically remain in place throughout all remaining process steps, so that the beneficial stresses imparted to the channel region by the stressed overlayer is maintained in the final device configuration. Furthermore, the presence of any intermediate device elements or material layers between a stressed overlayer and the targeted channel region of a MOS transistor—such as the aforementioned gate electrode, sidewall spacer elements and gate dielectric layer—may tend to mitigate the level of stress than can be transferred through those elements or layers to the channel. Additionally, since the type of intrinsic stress used to increase hole mobility along the channel length of PMOS transistor elements (i.e., a compressive stress) differs from the type of stress used to increase electron mobility along the channel length of NMOS transistor elements (i.e., a tensile stress), different materials and deposition parameters may be required to form each type of stressed overlayer. Moreover, sophisticated photolithography and/or etching techniques may also be necessary to facilitate the formation of stressed overlayers, thus increasing overall processing complexity and costs, while potentially reducing product yield.

One promising technique for inducing the desired state of stress in the channel region of PMOS transistors—which may be used in lieu of, or possibly even in combination with, the stressed overlayer approach described above—is to embed stressed material regions in the active area of the PMOS device. This approach involves forming cavities in the device substrate adjacent to the gate electrode structure of the PMOS device, and then epitaxially forming a stressed silicon-based semiconductor material, such as silicon-germanium, in the cavities. This epitaxially formed material tends to induce the desired compressive stress in the channel region of the PMOS device, as will be described more fully below.

FIGS. 1a-1f depict one illustrative prior art integration scheme that has been used for forming a CMOS device that includes both NMOS and PMOS transistors, wherein a stressed material region is formed in the active area adjacent to the channel region of the PMOS device. More specifically, FIG. 1a shows a simplified schematic cross-sectional view of an illustrative semiconductor device 100 during an early stage of manufacturing. The device 100 includes an illustrative substrate 101, which may represent any appropriate carrier material for having formed thereon or thereabove a semiconductor layer 103.

The device 100 may generally include device regions 100N and 100P in which illustrative NMOS and PMOS transistor elements 150n and 150p, respectively (see FIG. 1f), may be formed during later manufacturing stages, as will be discussed in further detail below. The device regions 100N and 100P may include active areas 105n and 105p, respectively, which may in turn be defined and enclosed by isolation structures 104, as illustrated in FIG. 1a. In certain illustrative embodiments, the isolation structures 104 may be provided in the form of a shallow trench isolation, as may typically be used for sophisticated integrated circuits. Additionally, the active areas 105n, 105p may also include an appropriate dopant species for establishing the requisite conductivity type. For example, a p-type dopant, such as boron or boron difluoride, may be incorporated into the active area 105n so as to form a p-well, in and above which may be formed NMOS transistor elements. On the other hand, an n-type dopant, such as phosphorous or arsenic and the like, may be incorporated into the active area 105p, thereby forming an n-well in and above which PMOS transistors may be formed.

In the manufacturing stage depicted in FIG. 1a, gate electrode structures 120n and 120p have been formed in the device regions 100N and 100P and above the active areas 105n and 105p, respectively. Each of the gate electrode structures 120n and 120p may include a plurality of layers and materials, depending on the desired transistor element types and overall integration scheme. For example, in some CMOS integrations, the transistor architecture may be based on a conventional gate insulating layer and polysilicon gate electrode (polySiON) configuration, wherein the materials making up each of the gate electrode structures 120n and 120p are adapted accordingly. On the other hand, transistor architecture for both gate electrode structures 120n and 120p may be based on a more advanced high-k dielectric and metal gate electrode (HK/MG) configuration, wherein a high-k dielectric material should be understood to be a material having a dielectric constant, or "k-value," of approximately 10 or greater. Furthermore, in still other CMOS integrations, the respective gate electrode structures 120n and 120p may also have substantially different configurations from one another (e.g., polySiON vs. HK/MG, or vice versa), again depending on the overall device design criteria. However, for simplicity, the illustrative gate electrode structures 120n and 120p of FIG. 1a are both depicted as being based on a conventional polySiON gate electrode configuration, as will now be described.

As shown in FIG. 1a, each of the gate electrode structures 120n and 120p may be made up of, for example, a gate insulation layer 107, which may typically be a silicon dioxide or silicon oxynitride material layer, and a gate electrode 108 made of, for example, polysilicon material. Furthermore, the gate insulation layers 107 of the gate electrode structures 120n and 120p may separate the gate electrodes 108 from channel regions 106n and 106p, respectively, therebelow. Additionally, the gate electrode structures 120n, 120p may also include a gate cap layer 109 that is made up of, for example, silicon nitride, and which is adapted to protect the gate electrode 108 during subsequent device processing, such as during etch steps and the like. The gate electrode structures 120n, 120p shown in FIG. 1a may be formed using techniques that are well known to those skilled in the art, e.g., depositing and/or forming a stack of material layers as may be appropriate for the specific gate electrode type, followed by performing one or more etching processes to define the gate electrode structures 120n, 120p, including the gate cap layers 109 positioned thereabove.

FIG. 1b depicts the illustrative semiconductor device 100 of FIG. 1a after several manufacturing operations have been performed, some of which will now be described. First, a spacer layer 114, such as, for example, silicon nitride and the like, is blanket-deposited above the device 100, so as to cover both of the device regions 100N and 100P. Thereafter, an etch mask (not shown) is formed above the device 100 and patterned so that the etch mask covers the NMOS device region 100N and exposes at least a portion of the spacer layer formed above the PMOS device region 100P. A selective anisotropic etching process, such as a reactive ion etch (RIE) process and the like, is then performed so as to form sidewall spacers 114s on the sidewalls of the gate electrode structure 120p, and to remove the exposed portion of the spacer layer 114 from above the active area 105p. Next, one or more etching processes are performed to define a plurality of cavities 115 in the semiconductor material 103, i.e., in the active area 105p of the PMOS region 100P. During these one or more etching processes, the gate electrode 108 of the gate electrode structure 120p may be substantially protected from the effects of the etch chemistries by the sidewall spacers 114s and the gate cap layer 109. Furthermore, the remaining portions of the spacer layer 114 may act as a hard mask to protect the NMOS device region 100N and any covered portions of the PMOS device region 100P.

The position of the cavities 115 relative to a channel region 106p below the PMOS gate electrode structure 120p is typically determined by the thickness 114t of the sidewall spacers 114s, and will ultimately affect the level of stress that can be induced in the channel region 106p. Furthermore, the width 115w and depth 115d of the cavities 115 may vary depending on the particular device application and/or processing requirements. For example, in some applications, the depth 115d may range anywhere from 50-70 nm, and the width 115w may extend across the active area 105p from a point that is substantially aligned with and below the sidewall spacers 114s, and over to the trench isolation structures 104 that define the extent of the active area 105p. However, cavities 115 having a narrower width 115w may also be used, as is shown for the illustrative semiconductor device 100 of FIG. 1b.

After the cavities 115 have been formed in the active area 105p, an epitaxial deposition process is then performed so as to form an embedded stressor material region 117 in the cavities 115. In one example, a two-step epitaxial process may be used to form the embedded stressor material region 117, in which case the region 117 may include a first material layer 117a that is an undoped layer of silicon-germanium (SiGe) material having a germanium content of approximately 20%, and which may tend to impart a compressive stress in the channel region 106p, as will be further discussed below. Furthermore, the embedded stressor material region 117 may also include a second material layer 117b that is made up of an undoped material layer that is substantially silicon. In certain applications, the use of the second material layer 117b that is substantially made up of silicon may be necessary so as to avoid material agglomeration problems that may potentially occur when, during later processing steps, a nickel silicide contact region is formed in a layer of material that includes some amount of germanium, resulting in a so-called "spotty" nickel silicide contact. The presence of an upper material layer in the embedded stressor material region 117 that is substantially silicon—such as the second material layer 117b—may substantially avoid such "spotty" nickel silicide occurrences.

Depending upon the particular application, the thickness of the first material layer 117a may range from 40-50 nm, and in some cases may substantially fill the cavities 115, depending on the device processing parameters and/or the degree of compressive stress required. Furthermore, when used, the second material layer 117b may have a thickness that ranges from 15-20 nm, which would typically correspond to the approximate thickness of any nickel silicide material formed in the contact regions of the active area 105p. Additionally, in some cases the complete embedded stressor material region 117 may have a raised upper surface 117s relative to an interface of the channel region 106p and the gate insulating layer 107.

As is well known to those having skill in the art, during an epitaxial deposition process, the material comprising the silicon-based substrate acts as a "seed crystal." Therefore, during the epitaxial deposition process, silicon-based materials will only be formed on the exposed surfaces of silicon-containing semiconductor materials. On the other hand, surfaces that are covered by dielectric materials such as silicon nitride, silicon dioxide and the like, will be effectively "masked." Therefore, as shown in FIG. 1b, epitaxially deposited material will not be formed on, for example, the spacer layer 114 present above the NMOS device region 100N and portions of the PMOS device region 100P. Furthermore, epitaxially deposited material will not be formed on the sidewall spacers 114s, or the gate cap layer 109 of the gate electrode structure 120p.

While, in general, the silicon-based material comprising the semiconductor layer 103—e.g., the PMOS active area 105p—will act as a "seed layer" during epitaxial deposition, the epitaxially deposited embedded stressor material regions 117 may also take on a lattice structure and crystal orientation that is substantially identical to those of the semiconductor layer 103 in the active area 105p. Furthermore, due to the relatively larger covalent radius of germanium atoms as compared to silicon atoms, the lattice structure of an unrestrained SiGe semiconductor material is generally larger than that of an unrestrained semiconductor material that is substantially silicon. Accordingly, when a SiGe semiconductor material is epitaxially deposited on a substantially crystalline silicon material—such as, for example, the semiconductor layer 103—the restrained lattice structure of the SiGe material may induce a localized stress on the surrounding lattice structure of the substantially silicon material of the semiconductor layer 103. In this way, an epitaxially deposited semiconductor material region comprising SiGe that is formed in the cavities 115 of the active area 105p—such as the first material layer 117a of the embedded stressor material region 117—may induce a compressive stress (indicated by arrows 162) on the channel region 106p of the PMOS transistor elements formed in the device region 100P. Accordingly, an overall improvement in device performance may be realized due to an enhanced hole mobility, as previously described.

As shown in FIG. 1c, a selective etch process 130, which may include multiple etching steps, is thereafter performed to remove the remaining portions of the spacer layer 114 (i.e., the hardmask layer) from above the device regions 100N and 100P, the sidewall spacers 114s, and the cap layers gate 109 from the gate electrode structures 120n and 120p. Then, as shown in FIG. 1d, first spacer elements 124 are formed adjacent to the sidewall of the NMOS and PMOS gate electrode structures 120n and 120p, respectively, using material layer deposition and etching techniques well known in the art. At this point, one or more ion implantation sequences are performed so as to form certain doped regions in the active areas 105n, 105p, such as, for example, a tilt-angle implantation sequence 131 to form halo implant regions 141, and/or a shallow implantation sequence 132 to form extension implant regions 142, and the like. As should be appreciated by those of ordinary skill, the implantation sequences 131 and 132 may each include various masking and implantation steps, and the implantation parameters, such as implantation energy, ion/dopant type, implant angle, and the like, may vary according to the specific transistor type and device design criteria. Furthermore, it should be appreciated that the thickness of the first spacer elements 124 is typically adjusted as required to establish the position and extent of the device extension and/or halo implant regions 142, 141.

As shown in FIG. 1e, second spacer elements 125 are then formed adjacent to the first spacer elements 124 based on techniques and materials known in the art, as noted previously. Thereafter, a deep ion implantation sequence 133 is performed so as to form deep source and drain regions 143 in the active areas 105n, 105p of the PMOS and NMOS device regions 100N, 100P, based on masking and implantation techniques, dopant materials, and the like, that are known to those skilled in the art. As with the first spacer elements 124 above, the thickness of the second spacer elements 125 may also be adjusted so as to properly locate the deep source and drain implant regions 143 relative to the gate electrode structures 120n, 120p and the channel regions 106n, 106p.

As shown in FIG. 1f, the illustrative semiconductor device 100 may then be subjected to a heat treating process 134 that is adapted to: 1) repair any damage that may have occurred to the crystalline lattice structure of the active areas 105n and 105p during the ion implantation sequences 131, 132 and/or 133; and 2) activate any implanted dopant materials.

In one example of a typical state-of-the-art process flow, the heat treating process 134 may include a rapid thermal annealing (RTA) process, sometimes referred to as a spike annealing process. Typically, an RTA anneal is performed in the range of 1000-1100° C., where the temperature is above the 1000° C. level for approximately 10 seconds, and a peak temperature of around 1100° C. is maintained for approximately 2 seconds. In certain cases, the RTA process may be supplemented by a second annealing process so as to maximize dopant activation. For example, an ultra-fast annealing (UFA) process of extremely short duration, such as, for example, a flash lamp annealing process, a laser spike annealing (LSA) process, and the like, may be performed after the RTA anneal. Generally, the UFA anneal is performed at a higher temperature than the RTA anneal, but for a significantly shorter amount of time, such as, for example, a total time that is up to 3-4 orders of magnitude shorter in duration. For example, in a typical UFA process, a peak temperature in the range of 1200-1300° C. may be achieved, but the process may only last for approximately 10 milliseconds, or even less.

As a result of the dopant activation that occurs during the heat treating process 134, source and drain regions 144 of the NMOS and PMOS transistor elements 150n, 150p, respectively (schematically depicted in FIG. 10 may be established and corresponding P-N junctions created in the active areas 105n and 105p of the device regions 100N and 100P, respectively. Additional processing operations may then be performed to complete fabrication of the semiconductor device 100; e.g., forming metal silicide regions on the source/drain regions 144 and/or the gate electrodes 108, forming various contact elements and metallization layers, etc.

One problem associated with the prior art process flow described above is that the epitaxially formed embedded stressor material regions 117 are subjected to various implantation sequences as described above—e.g., a halo region implantation sequence 131, an extension region implantation sequence 132, and a source/drain implantation sequence 133. During one or more of the implantation sequences, the embedded stressor material regions 117 may suffer associated damage to the lattice structure of one or both of the first and second material layers 117a, 117b, which may sometimes cause at least a partial stress relaxation of the embedded stressor material regions. Additionally, when the semiconductor device 100 is subjected to the heating process 134 so as to repair any such lattice structure damage and to activate the implanted dopant ions, the embedded stressor material regions 117 may sometimes have a tendency to relax, particularly the constrained SiGe material of the first material layer 117a. As a result, the embedded stressor material regions 117 may ultimately impart a lesser degree of compressive stress 162 in the channel region 106p of the PMOS transistors 150p. This in turn may tend to reduce the performance capabilities of the PMOS transistor elements 150p formed in the device region 100P, as well as that of any semiconductor device 100 that may include such PMOS transistors 150p. Moreover, the above-described process flow does not incorporate any steps that would tend to impart a tensile stress in the active area 105n of the device region 100N, which might otherwise positively affect the mobility of electrons in the channel region 106n of the NMOS transistors 150n and enhance the performance capabilities thereof.

Furthermore, it should be appreciated that during the typical heat treating process performed to heal any crystalline damage and to activate implanted dopants, such as the heat treating process 134 described above, the dopant atoms will commonly diffuse to one degree or another through the semiconductor material of the active areas 105n, 105p. Such dopant diffusion is schematically depicted by the change between the as-implanted extension and deep source/drain regions 142 and 143 shown in FIG. 1e, and the final as-annealed source/drain regions 144 as shown in FIG. 1f. For some semiconductor devices, the amount of dopant diffusion may be planned and optimized as part of the overall device integration scheme, so as to define and set the location of the P-N junctions of the respective devices. However, as semiconductor devices are aggressively scaled from the 32 nm design node down to the 28 nm or 22 nm nodes, or even smaller, critical dimensions such as gate length and the like are significantly decreased. In such aggressively scaled devices, even small amounts of unwanted dopant diffusion in critical device areas—such as the channel regions 106n and/or 106p of the transistors 150n and/or 150p—may be undesirable, as it could cause detrimental short channel behavior in some devices, thereby leading to a commensurate overall decrease in device performance.

The present disclosure is directed to various methods that may avoid, or at least reduce, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to methods for forming dual embedded stressor regions in semiconductor devices such as transistor elements and the like, using in situ doping and substantially diffusionless annealing techniques. One illustrative method disclosed herein includes forming a plurality of first cavities in a first active area of a PMOS device region of a semiconductor substrate, wherein the first cavities are formed between a first gate electrode structure formed above the first active area and an isolation structure defining the first active area, and performing a first epitaxial deposition process to form in situ doped first embedded material regions comprising a first type of semiconductor material in the plurality of first cavities. Additionally, the method also includes forming a plurality of second cavities in a second active area of an NMOS device region of the semiconductor substrate, wherein the second cavities are formed between a second gate electrode structure formed above the second active area and an isolation structure defining the second active area, and performing a second epitaxial deposition process to form second embedded material regions comprising a second type of semiconductor material in the plurality of second cavities, wherein the second type of semiconductor material is different than the first type of semiconductor material. The method further includes, among other things, performing a single heat treating process to activate dopants in the in situ doped first and second embedded material regions.

In another illustrative embodiment disclosed herein, a method includes, among other things, forming a plurality of first cavities in a first active area of a PMOS device region of a semiconductor substrate, wherein the first cavities are formed adjacent to a first gate electrode structure formed above the first active area. The illustrative method also includes performing a first epitaxial deposition process to form an in situ doped first semiconductor layer on exposed surfaces of each of the plurality of first cavities, the first semiconductor layer comprising a first silicon-germanium material, performing a second epitaxial deposition process to form an in situ doped second semiconductor layer on the first semiconductor layer, the second semiconductor layer comprising a second silicon-germanium material, and performing a third epitaxial deposition process to form an in situ doped third semiconductor layer above the first and second semiconductor layers, the third semiconductor layer comprising a substantially germanium-free silicon-based material. Furthermore, the disclosed method also includes forming a plurality of second cavities in a second active area of an NMOS device region of the semiconductor substrate, wherein the second cavities are formed adjacent to a second gate electrode structure formed above the second active area. Moreover, the method includes performing a fourth epitaxial deposition process to form an in situ doped fourth semiconductor layer on exposed surfaces of each of the plurality of second cavities, the fourth semiconductor layer comprising a silicon-carbon material, performing a fifth epitaxial deposition process to form an in situ doped fifth semiconductor layer on the fourth semiconductor layer, the fifth semiconductor layer comprising a substantially carbon-free silicon-based material, and performing a single heat treating process to activate dopants in the in situ doped first, second, third, fourth, and fifth semiconductor layers, wherein the single heat treating process is a substantially diffusionless annealing process.

BRIEF DESCRIPTION OF THE DRAWINGS

The disclosure may be understood by reference to the following description taken in conjunction with the accompanying drawings, in which like reference numerals identify like elements, and in which.

Figure 1A:
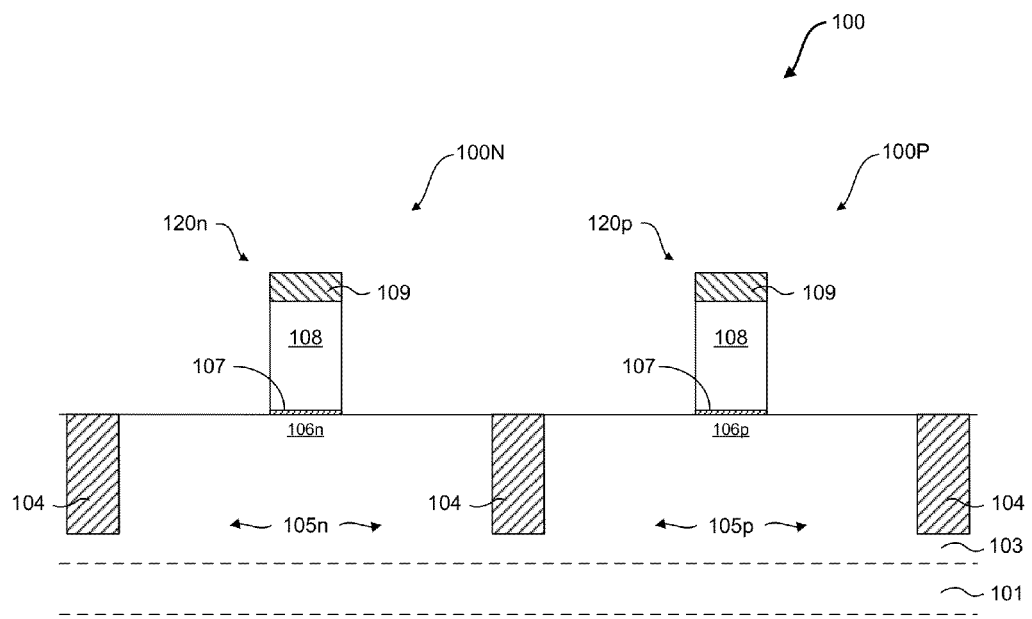
FIGS. 1a-1f schematically depict a representative prior art process flow for forming embedded stressor material regions in the active area of an illustrative PMOS device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter of the present disclosure is directed to various methods for forming embedded stressor material regions in the active areas of NMOS and PMOS devices, as well as the associated structures resulting therefrom. In certain illustrative embodiments, the embedded stressor material regions of an illustrative NMOS device may be formed by epitaxially depositing a stressed semiconductor material, such as silicon-carbon (Si:C), whereas in other embodiments, the embedded stressor regions of an illustrative PMOS device may be formed from an epitaxially deposited stressed silicon-germanium (SiGe) semiconductor material. Additionally, in at least some embodiments, the deep source and drain regions of the illustrative semiconductor devices disclosed herein may be formed by in situ doping of the embedded stressor material regions during the epitaxial material deposition process. Accordingly, the problems and defects that might generally occur during the typical dopant ion implantation processes that are used to form deep source and drain regions—such as damage to the crystalline lattice structure in the active areas of semiconductor devices—may be substantially avoided. Furthermore, the positioning of dopants within the active areas of the disclosed devices may be closely controlled by adjusting the size, depth, and extent of cavities that are formed in the active areas adjacent to the gate electrode structures of the devices, in which the stressed semiconductor materials are epitaxially deposited.

Furthermore, in some illustrative embodiments disclosed herein, a substantially diffusionless annealing process may be used to activate the in situ deposited dopant atoms that are present in the embedded stressor material regions, so as to substantially avoid unwanted dopant diffusion in certain device areas, such as the channel regions of transistor devices, and the like. For purposes of the present disclosure, a substantially diffusionless annealing process should be understood to be a heat treating process wherein the heat treating temperature is maintained above the typical dopant activation and diffusion temperature threshold of approximately 600° C. for an extremely short duration, such as less than approximately one-tenth of a second (100 milliseconds), and in some cases for 10 milliseconds or even less. In this way, diffusion of the in situ deposited dopant atoms—which is a function of both the temperature achieved during the heat treating process, and the amount time the temperature is above the activation threshold—can be minimized, or even substantially eliminated. The in situ deposited dopant atoms therefore remain substantially where they are formed during the epitaxial deposition process—i.e., in the embedded stressor material regions. On the other hand, activation of the in situ deposited dopant atoms—which is only a function of the peak temperature that is achieved during the heat treating process, and is not a function of time at temperature—can be maximized.

Figure 2A:
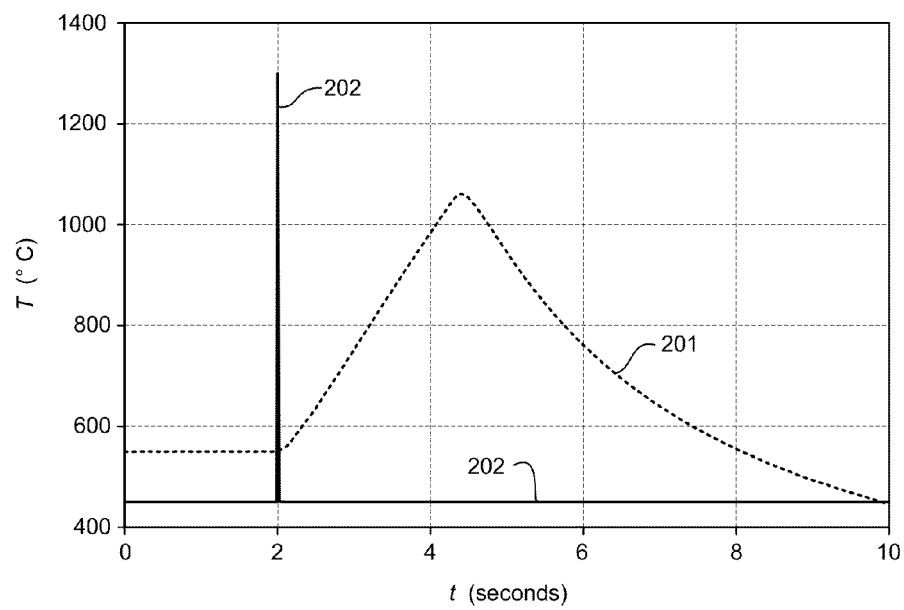
FIGS. 2a-2b graphically illustrate the comparative time/temperature curves of a representative rapid thermal annealing process and a representative ultra-fast annealing process.
Figure 2B:
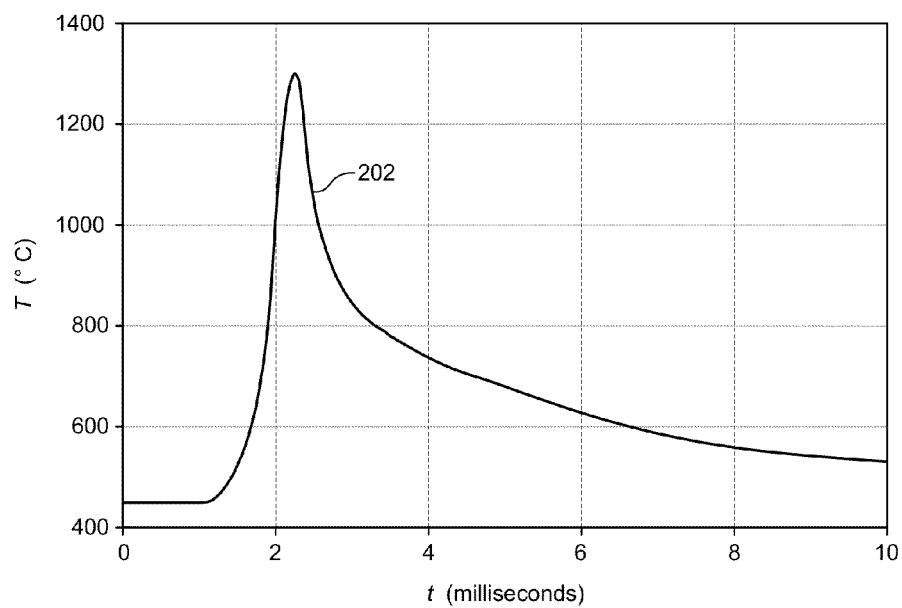

FIGS. 2a and 2b graphically illustrate the comparative time/temperature curves of a prior art thermal annealing process (identified by curve 201) during which associated dopant diffusion may commonly occur, and a substantially diffusionless prior art annealing process (identified by curve 202), during which dopant diffusion is minimized or even substantially eliminated. The thermal annealing process 201 may be representative of a typical prior art heat treating process, such as, for example, a rapid thermal annealing (RTA) or spike-annealing process and the like, which may be performed during state-of-the-art device processing so as to activate dopants, and to repair any damage that may have occurred to the crystalline lattice structure in the active area of the device during ion implantation. The annealing process 202 may be representative of an ultra-fast annealing (UFA) process, such as a flash lamp annealing process or a laser spike annealing (LSA) process.

FIG. 2a depicts a temperature scale in degrees C. on the y-axis of the graph, and a time scale in seconds on the x-axis of the graph. As shown in FIG. 2a, the thermal annealing process represented by curve 201 may typically occur over several seconds of time, wherein the temperature is above the 600° C. activation/diffusion threshold for approximately 5-6 seconds, and reaches a peak temperature of approximately 1000-1100° C. On the other hand, the substantially diffusionless annealing process, represented by curve 202, rapidly spikes up and down at the 2-second mark of the graph, reaching a peak temperature in excess of 1200° C., even up to approximately 1300° C.

FIG. 2b is a blow-up of the substantially diffusionless annealing process curve 202, where the time scale has been replaced with milliseconds (thousandths of a second) so as to more clearly illustrate the actual time vs. temperature configuration of the substantially diffusionless annealing process 202. As shown in FIG. 2b, the peak temperature of the substantially diffusionless annealing process 202 is quickly reached in approximately 1 millisecond, and rapidly dissipates over the next 6-8 milliseconds. Furthermore, the heat treating temperature of the substantially diffusionless annealing process 202 illustrated in FIG. 2b is above the activation/diffusion threshold for only about 4-5 milliseconds. Accordingly, when comparing the two time/temperature curves 201 and 202 shown in FIGS. 2a and 2b, it can readily be understood that the amount of dopant diffusion that will occur during the typical prior art thermal annealing process 201 that is used to correct lattice damage and activate dopants in some state-of-the-art device processing schemes will generally be substantially higher than any amount of dopant diffusion that may occur during the substantially diffusionless prior art annealing process 202, due in large part to the amount of time that each respective process is maintained above the activation/diffusion threshold of approximately 600° C.

As will be readily apparent to those skilled in the art upon a complete reading of the present application, the methods disclosed herein are applicable to a variety of technologies, and are readily applicable to a variety of different semiconductor devices, including, but not limited to, logic devices, memory devices, resistors, and the like. Furthermore, it should be appreciated that the general concepts set forth in the present disclosure may be employed in conjunction with one or more techniques used in manufacturing sophisticated semiconductor devices, such as conventional (polySiON) gate electrode manufacturing, or high-k dielectric metal gate electrodes (HK/MG) based on the so-called "gate-first" technique, or on the so-called "gate-last" or "replacement gate" manufacturing technique.

Figure 3A:
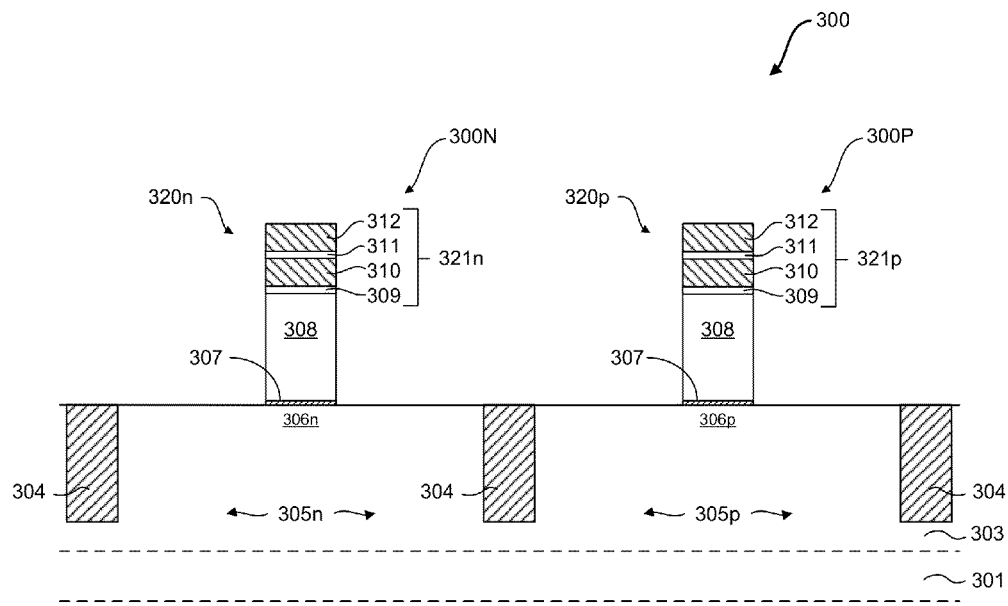
FIGS. 3a-3t schematically depict various illustrative steps used to form various embodiments of the illustrative embedded stressor regions disclosed herein.
Figure 3B:
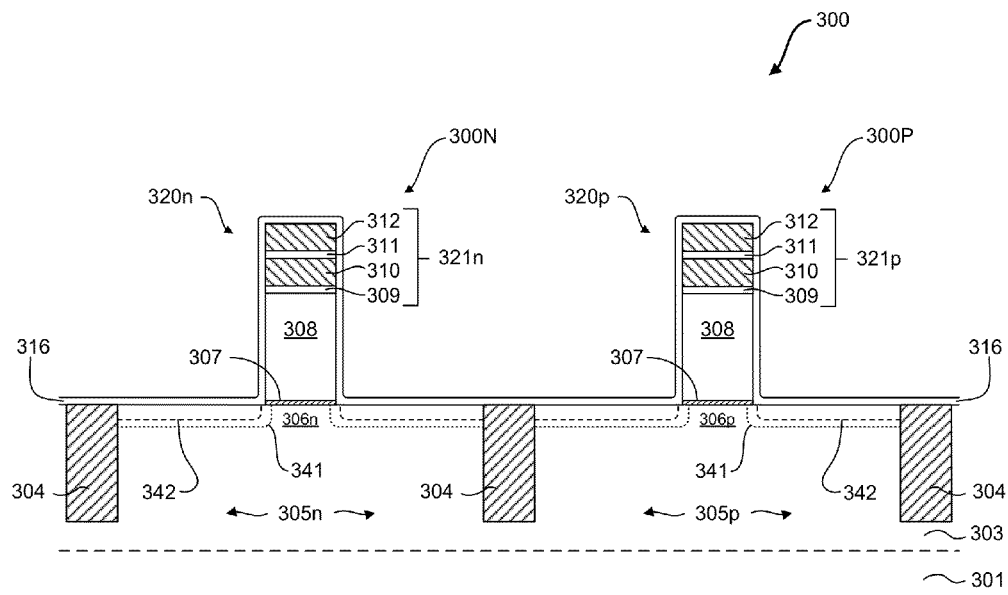
Figure 3C:
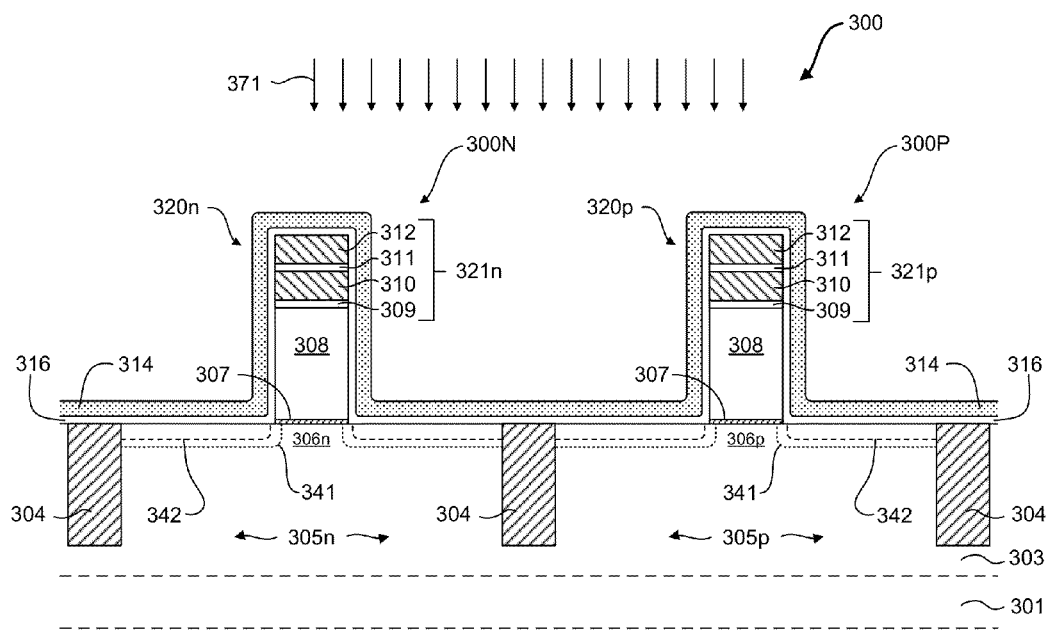
Figure 3D:
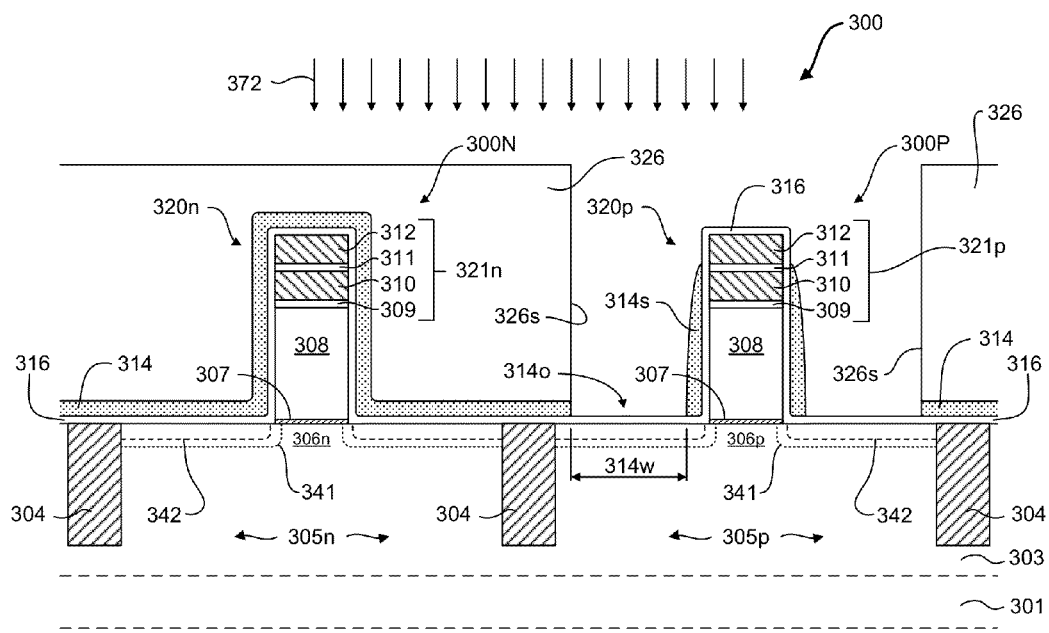
Figure 3E:
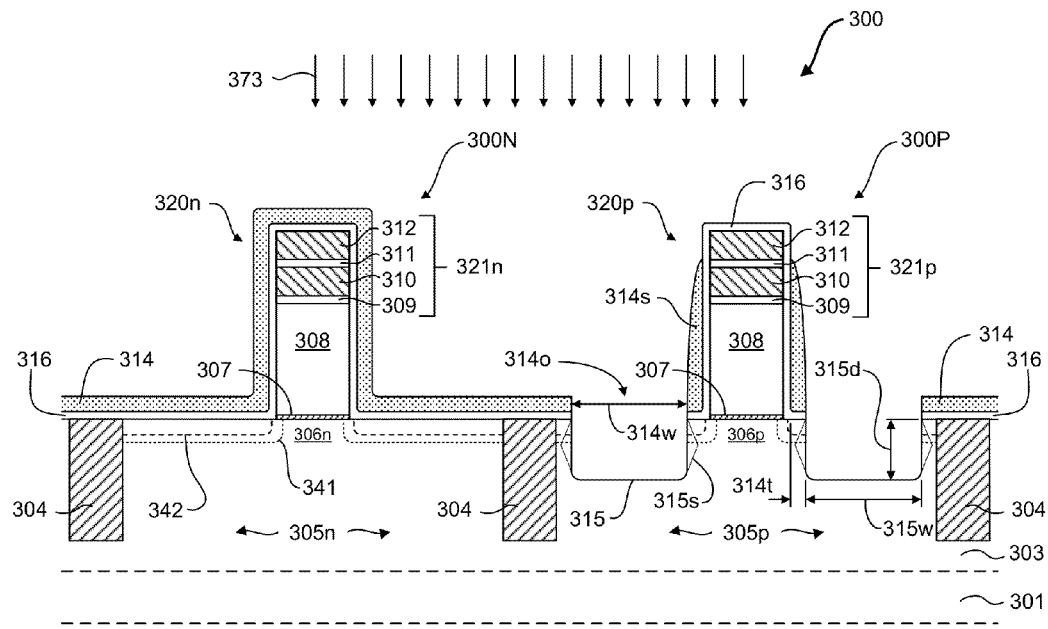
Figure 3F:
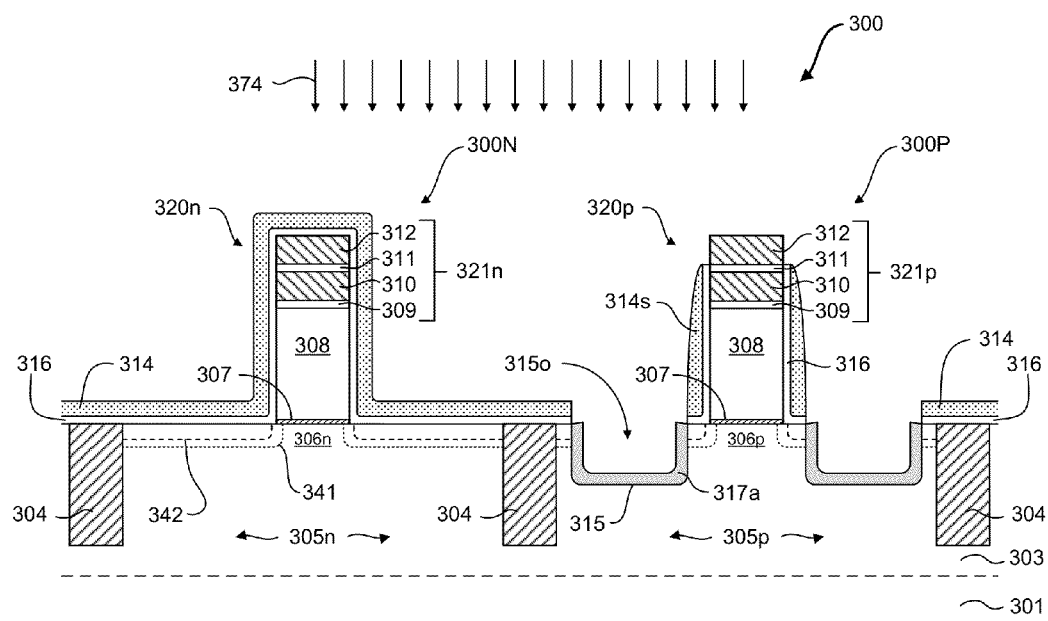
Figure 3G:
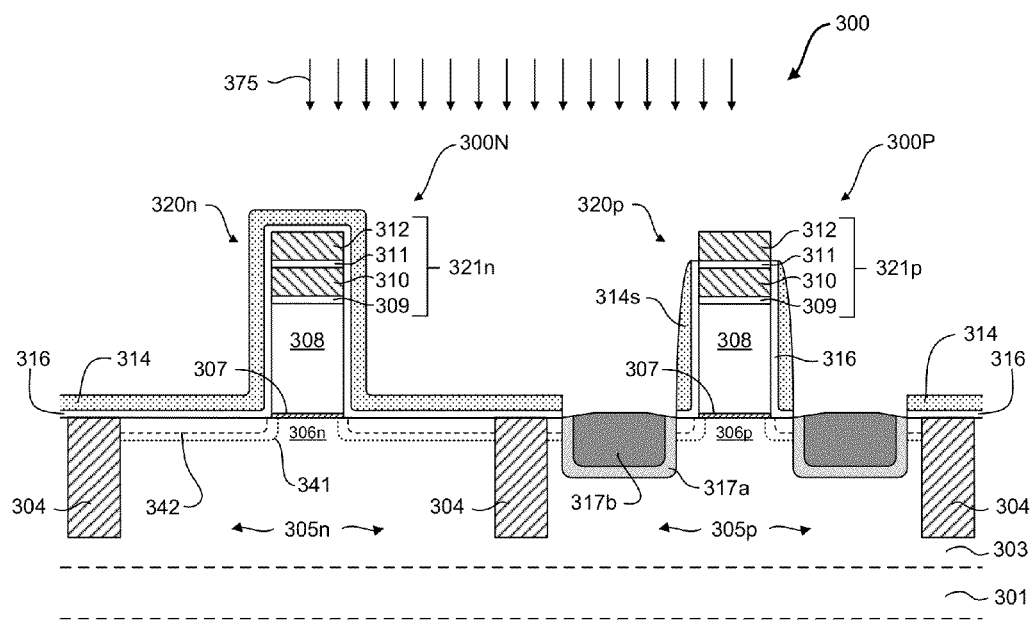
Figure 3H:
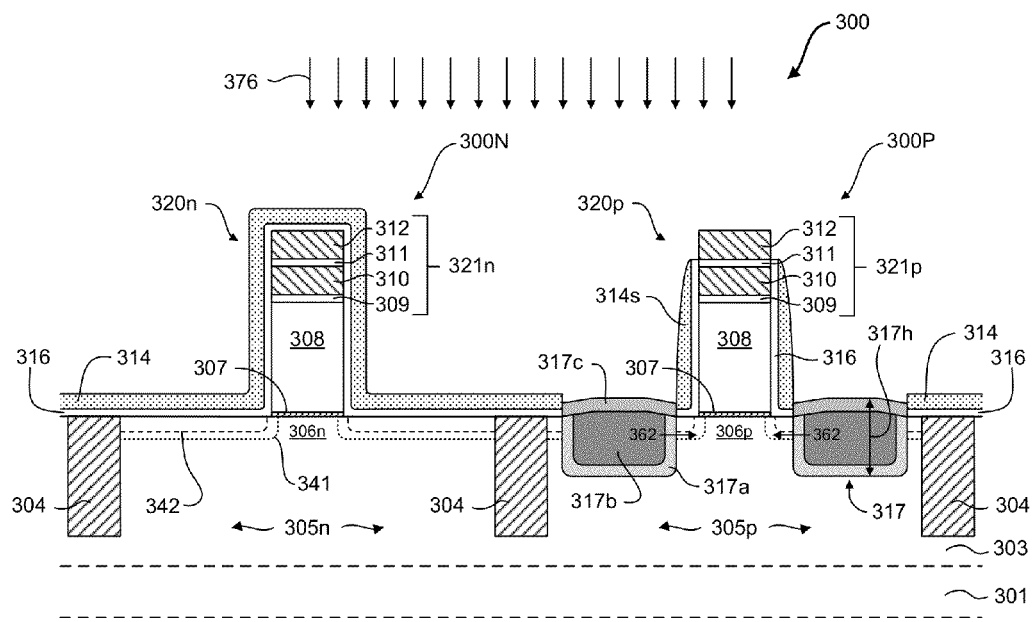
Figure 3I:
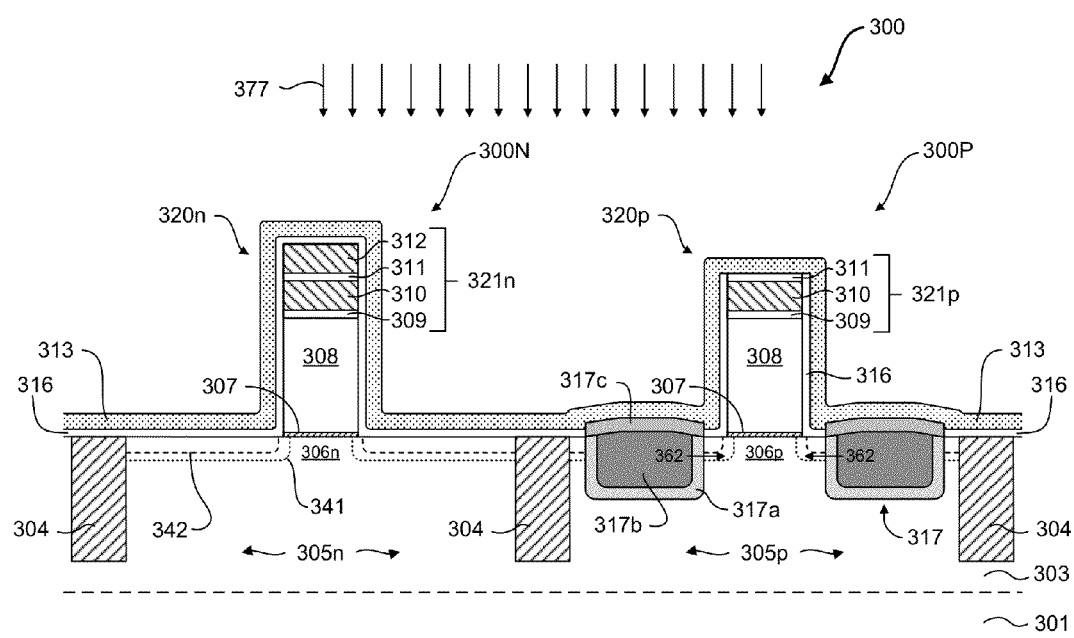
Figure 3J:
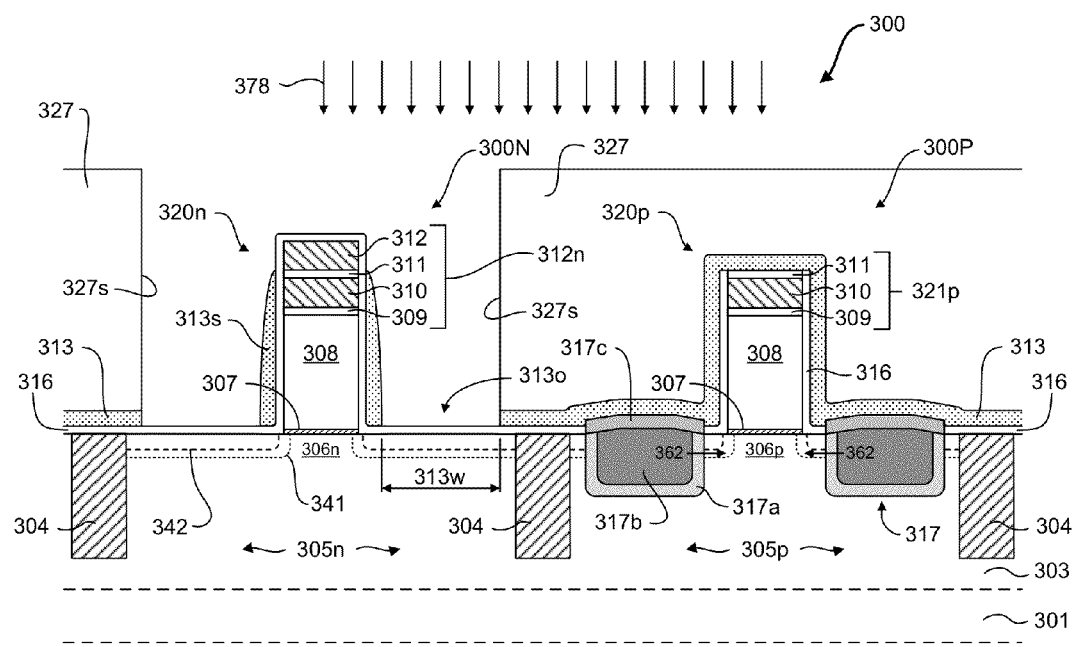
Figure 3K:
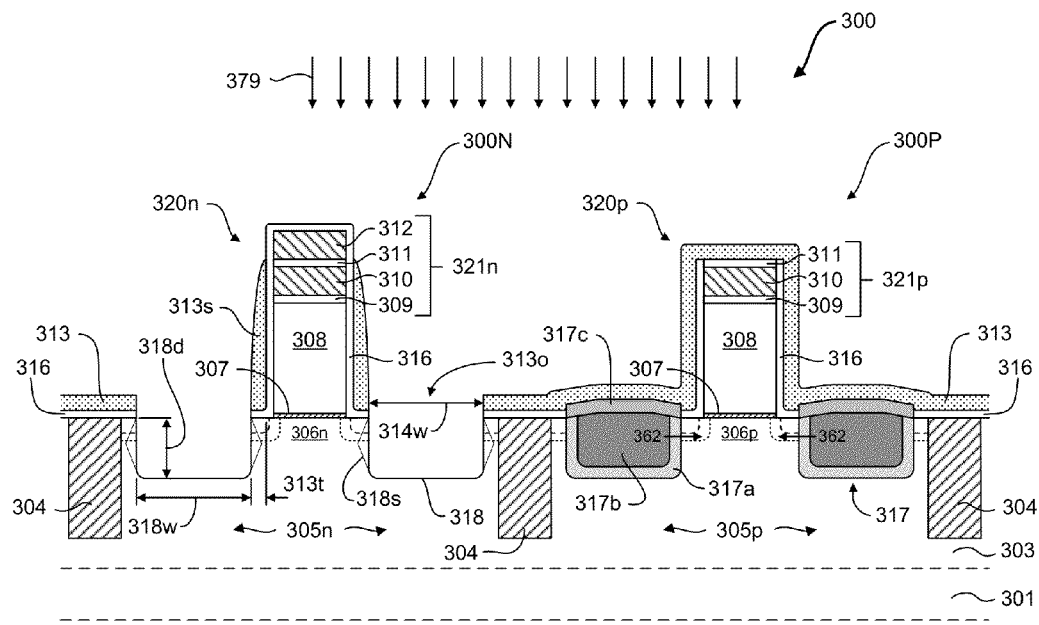
Figure 3L:
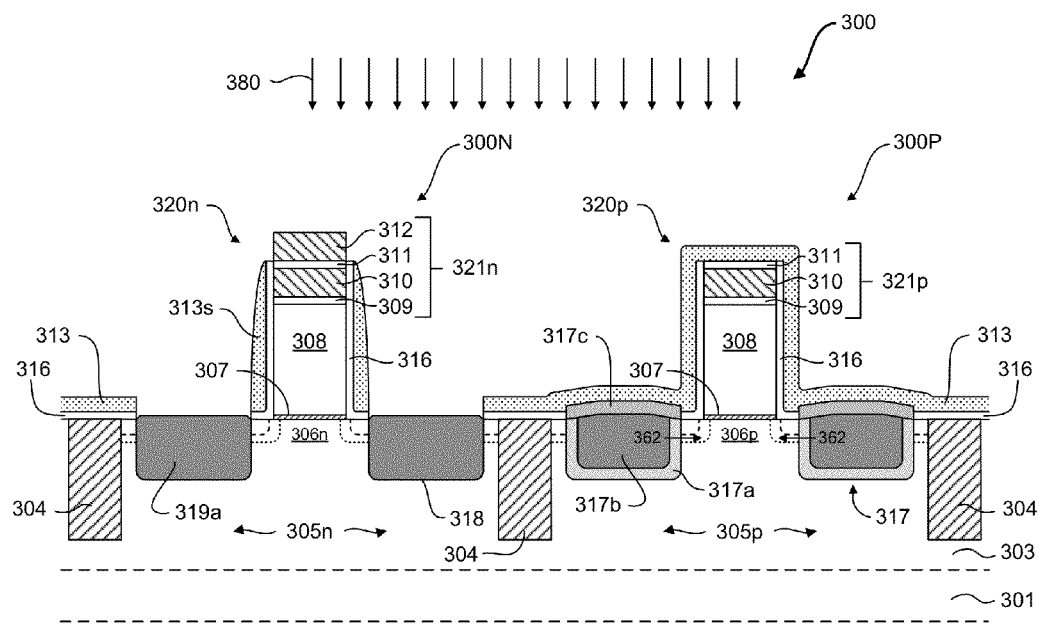
Figure 3M:
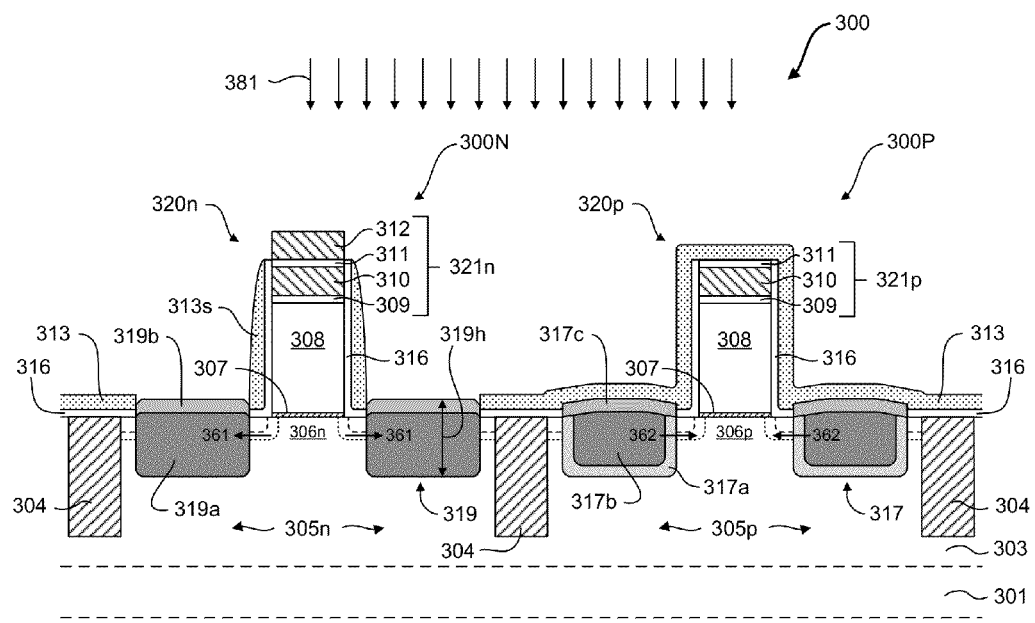
Figure 3N:
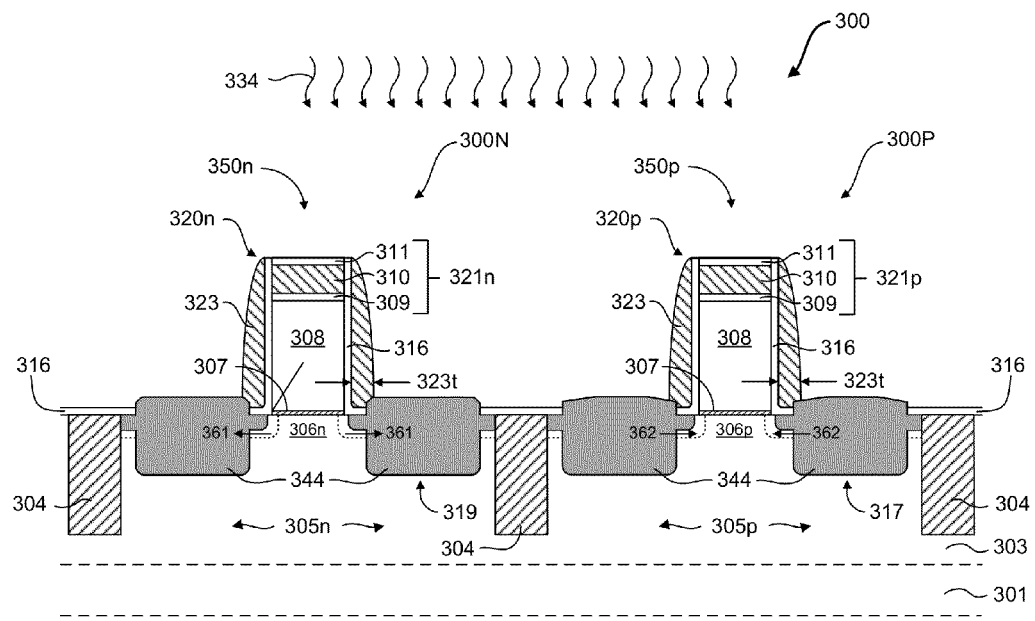
Figure 3O:
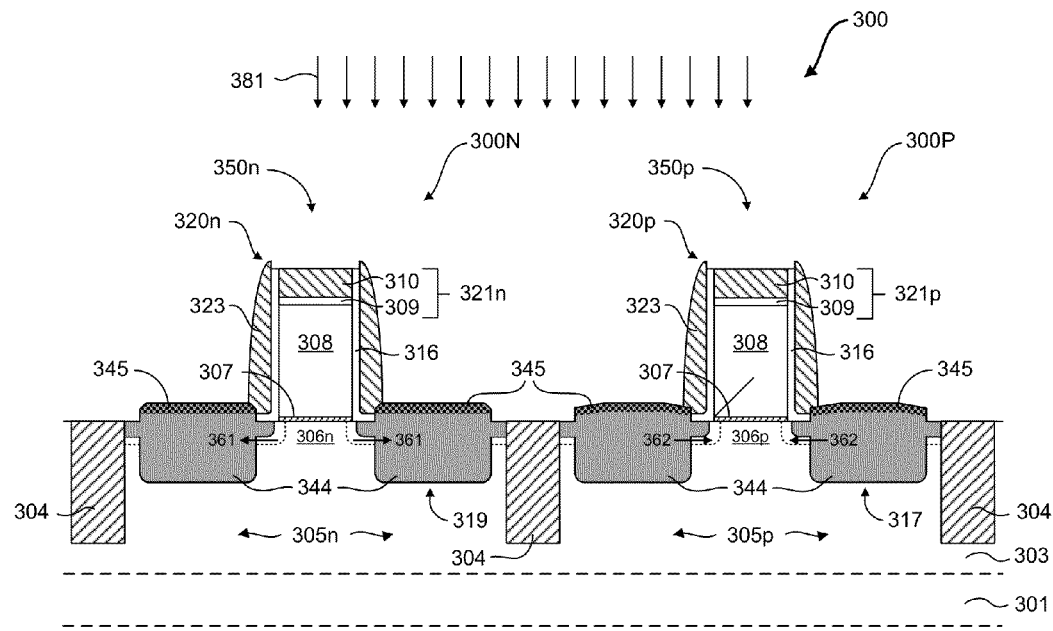
Figure 3P:
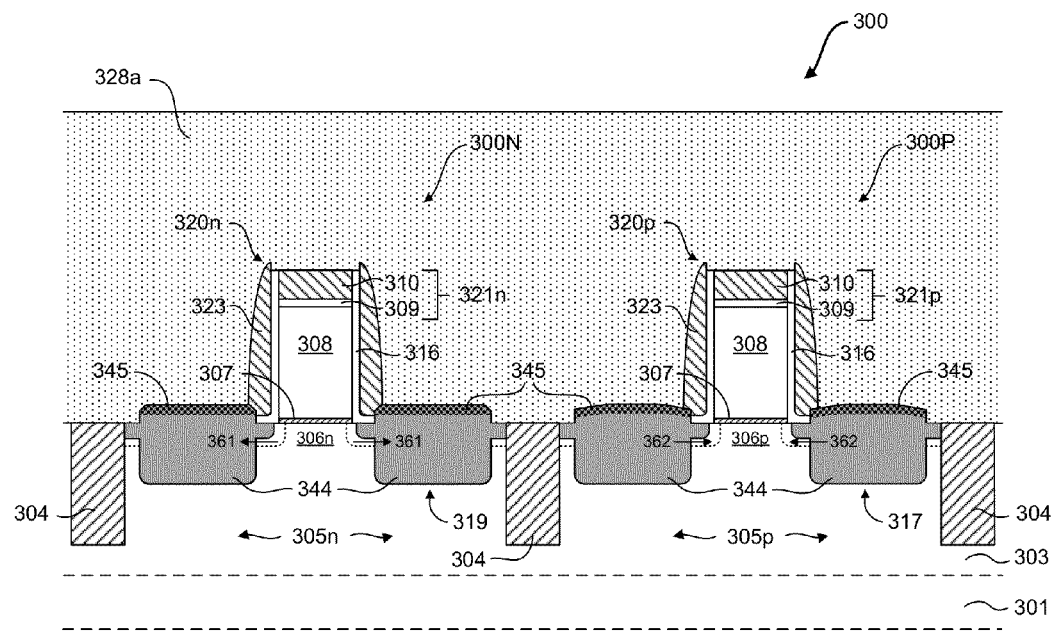
Figure 3Q:
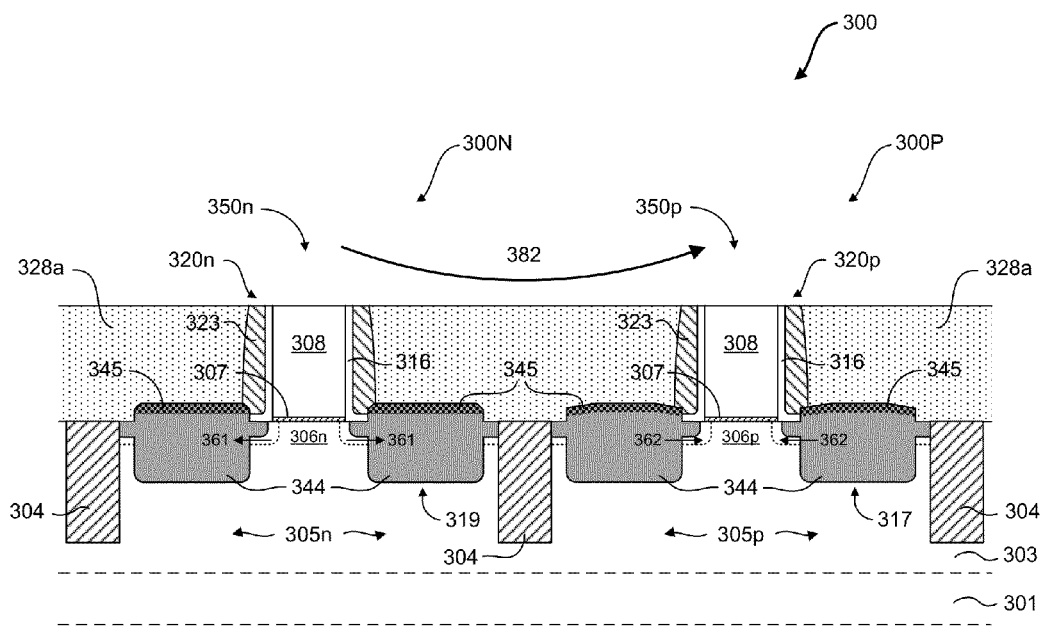
Figure 3R:
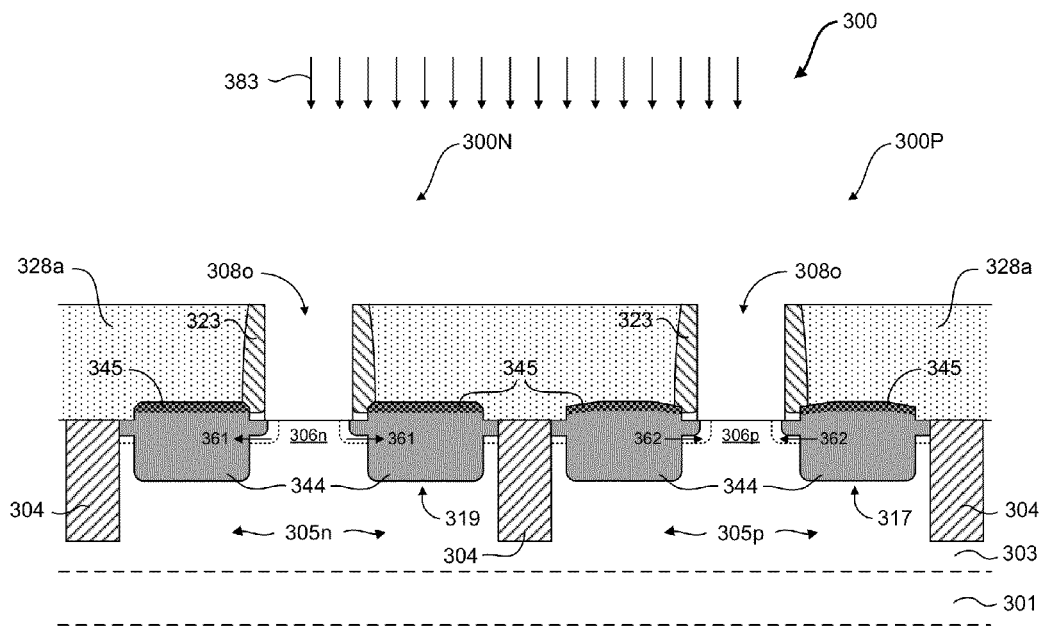
Figure 3S:
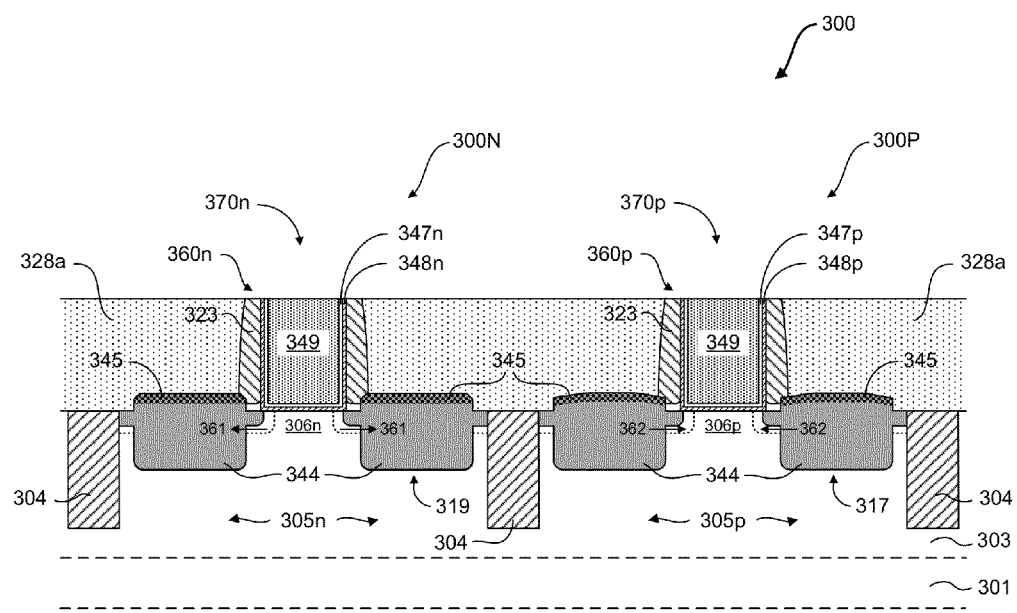
Figure 3T:
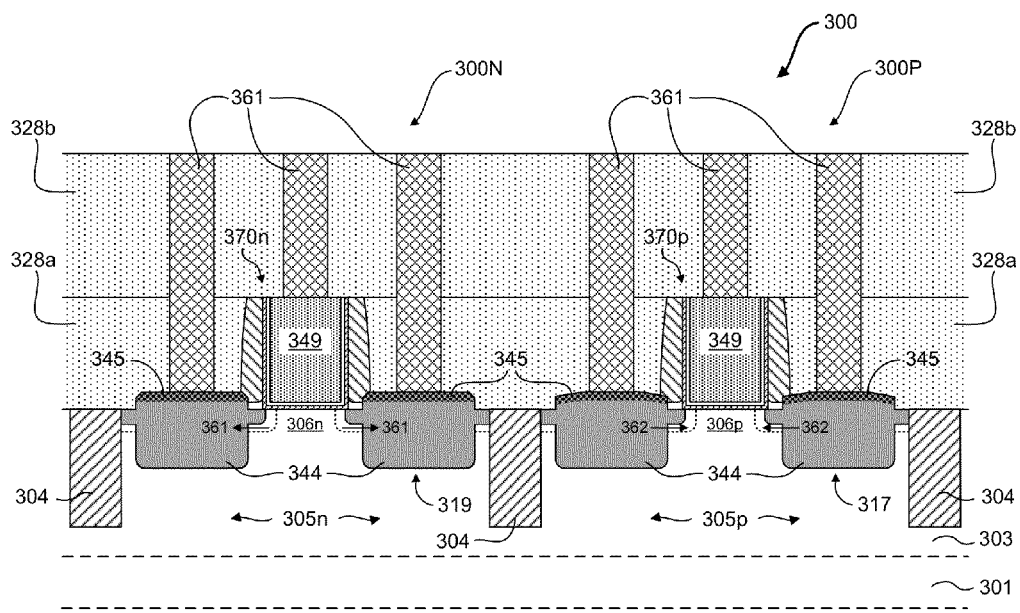

It should be noted that, where appropriate, the reference numbers used in describing the various elements shown in the illustrative embodiments of FIGS. 3a-3t may substantially correspond, where appropriate, to the reference numbers used in describing related elements illustrated in FIGS. 1a-1f above, except that the leading numeral in each figure has been changed from a "1" to a "3." For example, the semiconductor device "100" corresponds to the semiconductor device "300," the substrate "101" corresponds to the substrate "301," the active area "105p" corresponds to the active area "305p," and so on. Accordingly, the reference number designations used to identify some elements of the presently disclosed subject matter may be illustrated in the FIGS. 3a-3t but may not be specifically described in the following disclosure. In those instances, it should be understood that the numbered elements shown in FIGS. 3a-3t which are not described in detail below substantially correspond with their like-numbered counterparts illustrated in FIGS. 1a-1f and described in the associated disclosure set forth above.

Furthermore, it should also be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device 100 depicted in FIG. 1f, it should be understood that the gate electrode structures 120n and 120p are formed "above" the active areas 105n and 105p, respectively, and that the substrate 101 is positioned "below" or "under" the semiconductor layer 103. Similarly, it should also be noted that sidewall spacers 114s are positioned "adjacent to" the sidewalls of the gate electrode structures 120n and 120p, whereas in special cases, the spacers 114s may be positioned "on" the sidewalls of the gate electrode structures 120n and 120p in those configurations where no other layers or structures are interposed therebetween.

FIG. 3a depicts a schematic cross-sectional view of an illustrative semiconductor device 300 according to the present disclosure during an early stage of manufacturing. The illustrative device 300 is similar in many respects to the semiconductor device 100 as shown in FIG. 1a and described above, and as such, many of the details previously described with respect to the semiconductor device 100 will not be repeated here, except as may be required for clarity. It should therefore be appreciated that, while those similar aspects of the semiconductor device 100, such as materials, manufacturing techniques, device configurations, and the like, may be equally applicable to the illustrative semiconductor device 300 shown in FIG. 3a, only some specific aspects of the device 300 will be more fully described below.

As shown in FIG. 3a, the semiconductor device 300 may generally include device regions 300N and 300P, in which illustrative NMOS and PMOS transistor elements 350n and 350p, respectively (see, FIGS. 3n-3t), may be formed during subsequent manufacturing stages, as will be discussed in further detail below. The device regions 300N and 300P may include active areas 305n and 305p, respectively, which may in turn be defined and enclosed by isolation structures 304, and above which may be formed gate electrode structures 320n and 320p, respectively. Each of the gate electrode structures 320n and 320p may include a plurality of layers and materials, depending on the desired transistor element types and overall integration scheme.

For example, in some illustrative embodiments, the transistor architecture may be based on a conventional gate insulating layer and polysilicon gate electrode (polySiON) configuration, wherein the materials making up each of the gate electrode structures 320n and 320p are adapted accordingly. In other embodiments, the transistor architecture may be based on a more advanced high-k dielectric and metal gate electrode (HK/MG) configuration, wherein the so-called "gate first" technique is used to form the appropriate materials and layer configurations prior to the manufacturing stage illustrated in FIG. 3a. In yet further embodiments, the advanced HK/MG gate electrode configuration may be utilized based on the so-called "gate last" or "replacement gate" approach, in which case a "dummy" gate electrode structure that is substantially based on the conventional polySiON configuration may be used in the initial manufacturing stages, which may then be removed and replaced in later stages with the appropriate HK/MG material stack. However, for simplicity, the illustrative process flow described herein is based substantially on a conventional polySiON gate electrode configuration, which may later be replaced in a "gate last" technique as described with respect to FIGS. 3p-3t below.

As shown in FIG. 3a, each of the gate electrode structures 320n and 320p may be made up of, for example, a gate insulation layer 307 and a gate electrode 308. In certain illustrative embodiments, the gate insulation layers 307 may an appropriate silicon-based dielectric material, such as silicon dioxide or silicon oxynitride and the like, and the gate electrodes 308 may be a polysilicon material. Furthermore, the gate insulation layers 307 may separate the gate electrodes 308 of the respective gate electrode structures 320n and 320p from channel regions 306n and 306p therebelow, respectively. Additionally, the gate electrode structures 320n, 320p may also include respective gate cap layer stacks 321n, 321p, each of which may be made up of a plurality of material layers. For example, as shown in FIG. 3a, each of the gate cap layer stacks 321n, 321p may include a first liner layer 309, a first cap layer 310, a second liner layer 311, and a second cap layer 312. Depending on the desired processing requirements, the material types and thicknesses of the layers 309-312 may be adapted as required to protect the gate electrodes 308 during a plurality of etching and cleaning steps that may be performed during subsequent manufacturing stages, as will be more fully described below. In some embodiments, alternating layers 309-312 of the gate cap layer stacks 321n, 321p may be made up of different materials, which may be selectively etchable with respect to adjacent layers of the stacks 321n, 321p. For example, in certain illustrative embodiments, the first and second liner layers 309, 311 may be silicon dioxide material layers having a thickness in the range of 5-10 nm, whereas the first and second cap layers 310, 312 may be silicon nitride material layers with thicknesses on the order of 25-30 nm. It should be appreciated, however, that other material types and thicknesses may also be used, depending on the particular etch/clean steps that may be employed.

FIG. 3b schematically illustrates the semiconductor device 300 of FIG. 3a in a further advance manufacturing stage, after halo implant regions 341 and/or shallow extension implant regions 342 have been formed in the active regions 305n, 305p adjacent to the respective gate electrode structures 320n, 320p. The implant regions 341, 342 may be formed by a variety techniques well known in the art, including masking, ion implantation, etc., which will not be discussed here in detail. Furthermore, it should be appreciated that the positions of the implant regions 341, 342 relative to the gate electrode structures 320n, 320p may be established by one or more of several well-known techniques, including sidewall spacer formation, tilt-angle ion implantation, and the like.

Also as shown in FIG. 3b, in some illustrative embodiments of the present disclosure, a liner layer 316 may be formed above both of the device regions 300N and 300P, including the gate electrode structures 320n, 320p. In certain embodiments, the liner layer 316 may be made up of, for example, a silicon dioxide material, and furthermore may be formed by performing a suitable oxide deposition process, such as a chemical vapor deposition (CVD) process, and the like. Depending on the overall processing requirements, the thickness of the liner layer 316 may be adjusted as required to resist one or more etching and/or cleaning processes that may be performed during subsequent processing stages. For example, the thickness of the liner 316 may, in some embodiments, be in the range of 3-6 nm. Additionally, in certain embodiments of the present disclosure, an oxidation process, such as a wet chemical oxidation process and the like, may be performed prior to forming the liner layer 316, so as to form thin oxide layers (not shown) on the exposed silicon and polysilicon surfaces of the active areas 305n, 305p and the gate electrodes 308, respectively. The thickness of the thin oxide layers (not shown) may be less than approximately 1-2 nm, and in some embodiments may be approximately 5 Å or even less.

It should be appreciated that, depending on the overall process flow, the liner layer 316 may be formed either before or after the halo and/or shallow extension implant regions 341, 342 have been formed in the respective active areas 305n, 305p. Furthermore, in some illustrative embodiments, an optional heat treating process, such as a substantially diffusionless ultra-fast annealing (UFA) process, e.g., a laser spike or flash lamp annealing process, may be performed during this stage of device manufacturing so as to activate the dopants in the implant regions 341, 342, and so as to repair any damage to the crystalline lattice structure that may have been created during the ion implantation processes that were used to form those regions. As previously noted, the UFA process may be performed such that the annealing temperature is maintained for less than 100 milliseconds, and in some cases for 10 milliseconds or even less. However, in other illustrative embodiments, the heat treating process used to activate the dopants in the halo and/or shallow implant regions 341, 342, and to repair any implantation-related lattice damage, may be delayed, and subsequently performed in conjunction with the heat treating step used to activate the dopants in the deep source and drain regions of the devices, as detailed below.

FIG. 3c schematically depicts the illustrative semiconductor device 300 of FIG. 3b after a spacer layer 314 has been formed above both device regions 300N and 300P of the device 300. In some embodiments, the spacer layer 314 may be made up of any one of several suitable etch selective materials, such as, for example, silicon nitride and the like. Furthermore, the spacer layer 314 may be formed by performing a suitably designed deposition process 371 that is adapted to deposit a substantially conformal material layer above the active areas 305n, 305p and the gate electrode structures 320n, 320p, such as, for example, a CVD process and the like. Furthermore, the thickness of the spacer layer 314 may be adjusted as necessary to establish the proximity of cavities 315 (see, FIG. 3e) that will be formed adjacent to the gate electrode structure 320p and the channel region 306p during a later manufacturing stage. For example, in some embodiments, the thickness of the spacer layer 314 may range from 5-20 nm, although other thickness may also be used, depending on the desired level of stress to be induced in the channel region 306p.

FIG. 3d schematically illustrates the semiconductor device 300 of FIG. 3c in a further advanced stage of manufacturing, after an etch mask 326 has been formed above the device 300 and patterned so as to expose at least a portion of the spacer layer 314 that is formed above the PMOS device region 300P. As shown in FIG. 3d, in some embodiments the etch mask 326 covers the NMOS device region 300N, as well as some portions of the PMOS device region 300P. Thereafter, the device 300 may be subjected to a suitably designed etch process 372, such as an anisotropic reactive ion etch (RIE) process and the like, that is adapted to selectively remove the exposed horizontal portions of the spacer layer 314 from above the liner layer 316 in the PMOS device region 300P, and to form sidewall spacers 314s adjacent to the sidewalls of the gate electrode structure 320p. Accordingly, an opening 314o may be formed in the spacer layer 314 on either side of the gate electrode structure 320p, and the corresponding width 314w of the opening 314o may be determined by the thickness 314t of the sidewall spacers 314s, relative to the sidewalls 326s of the etch mask 326, as shown in FIG. 3d.

Thereafter, as shown in FIG. 3e, the etch mask 326 may be removed from above the semiconductor device 300, and a further etch process 373 may be performed so as to form cavities 315 in the active area 305p, adjacent to and on either side of the gate electrode structure 320p. The position of the cavities 315 relative to the gate electrode structure 320p may be established based on the thickness 314t of the sidewall spacers 314s, which, as previously noted, may be determined by the as-deposited thickness of the spacer layer 314.

In certain illustrative embodiments, the etch process 373 may be a suitably designed anisotropic etch process, such as an RIE process and the like, which may thereby form substantially "U-shaped" cavities 315 in active area 305p, having width 315w and a depth 315d. The width 315w may be substantially determined by the width 314w of the opening 314o (see, FIG. 3d), and the depth 315d may be substantially determined by the etch time of the etch process 373. For example, in some illustrative embodiments, the depth 315d of the cavities 315 may be in the range of approximately 40-60 nm, whereas in at least one embodiment, the depth 315d may be approximately 50 nm. Other depths may also be considered, based on the desired placement of the first embedded stressor material region 317 (see, e.g., FIG. 3h), and/or the desired level of stress to be induced in the channel region 306p.

In other illustrative embodiments, the etch process 373 may include two separate etch steps that are adapted to form cavities 315 in the active area 305p having a so-called "sigma-shape," or "Σ-shape," represented in FIG. 3e by lines 315s. For example, the etch process 373 may comprise a first etch step, such as an RIE process as described above, and which is adapted to form a first portion of the cavities 315 having a substantially "U-shaped" configuration to a partial cavity depth. Thereafter, a second etch step, such as, for example, a crystallographically anisotropic etch process, may be performed. The crystallographically anisotropic etch process may utilize a suitable wet chemical etch recipe, such as a tetra methyl ammonium hydroxide (TMAH) etch recipe and the like, that may provide superior etch stop capabilities along certain crystallographic planes, such as the <111> plane. Therefore, for a given crystallographic configuration of the active area 305p, such as a configuration in which the surface of the semiconductor layer 303 may correspond to the <100> plane, inclined sidewall surfaces 315s may be obtained during the second etch step, which represent the <111> planes having a predefined inclination angle.

As shown in FIG. 3e, cavities 315 having a substantially "-shaped" configuration may, in certain embodiments, provide a degree of under-etching, i.e., below the gate electrode structure 320p, thereby placing the first embedded stressor material regions 317 (see, e.g., FIG. 3h) in closer proximity to the channel region 306p. Furthermore, in some illustrative embodiments, the "-shaped" cavities 315 may be formed to a greater cavity depth 315d than the "U-shaped" cavities described above, depending on the desired stress level in the channel region 306p. For example, in certain embodiments, the depth 315d of the "-shaped" cavities 315 may be on the order of approximately 60-80 nm, whereas in at least one embodiment the depth 315d may be approximately 70 nm. It should be appreciated, however, that both greater and lesser cavity depths 315d may also be used.

After the cavities 315 have been formed in the active area 305p, a pre-cleaning step may be performed so as to clean the exposed surfaces of the cavities 315 in preparation for forming the embedded stressor material regions 317, as is illustrated in FIGS. 3f-3h and described below. In certain embodiments, the pre-cleaning step may be adapted to selectively remove exposed portions of oxide liner 316 relative to the nitride spacer layer 314 and the second nitride cap 312 of the cap layer stack 321p above the PMOS gate electrode structure 320p. For example, in at least some embodiments, the pre-cleaning step may be a selective etch process, such as hydrofluoric acid (HF) process, and the like.

FIG. 3f shows the illustrative semiconductor device 300 of FIG. 3e in a further advanced manufacturing stage, after completion of the pre-cleaning step described above. The device 300 may then be exposed to a first deposition ambient 374 designed to epitaxially deposit a first layer 317a of a stressed silicon-containing semiconductor material in the cavities 315 that are formed in the active area 305p of the PMOS device region 300P. In some illustrative embodiments, the first layer 317a of stressed semiconductor material may comprise silicon-germanium (SiGe), in which case the deposition ambient 374 may be based on, for example, gaseous silicon sources such as silane ($SiH_4$), disilane ($Si_2H_6$), and/or trisilane ($Si_3H_8$), and gaseous germanium sources such as germane ($GeH_4$), digermane ($Ge_2H_6$), and/or trigermane ($Ge_3H_8$), and the like. Furthermore, in certain embodiments, the first deposition ambient 374 may be adjusted so that relative concentrations of the gaseous silicon and germanium sources results in the epitaxially deposited first layer 317a comprising a SiGe material having a germanium concentration in the range of 16-24% by weight, whereas in at least one embodiment, the first layer 317a has a germanium concentration of approximately 20%.

Figure 1B:
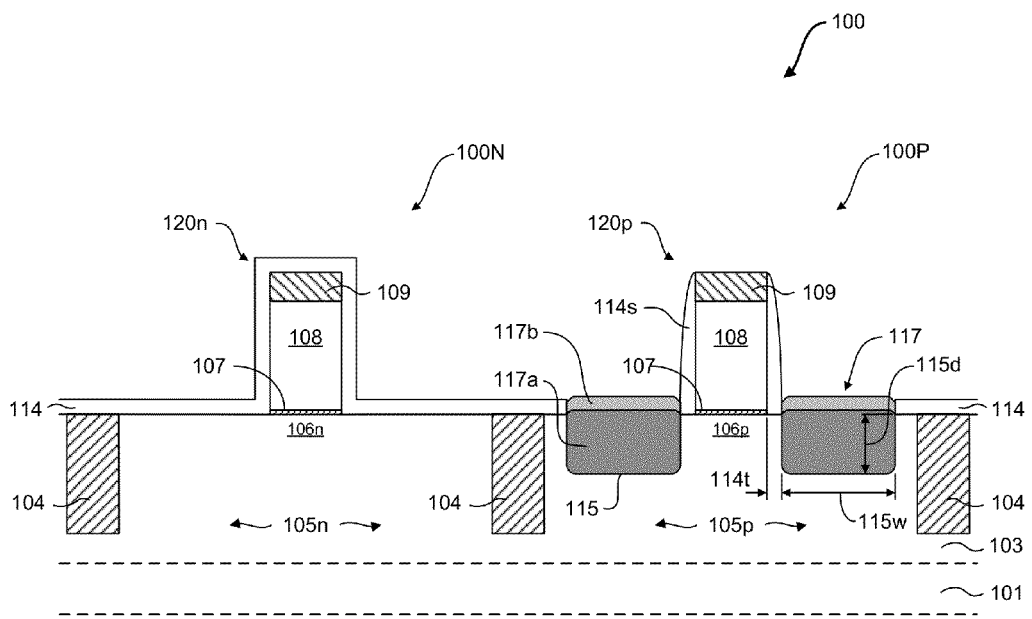
Figure 1C:
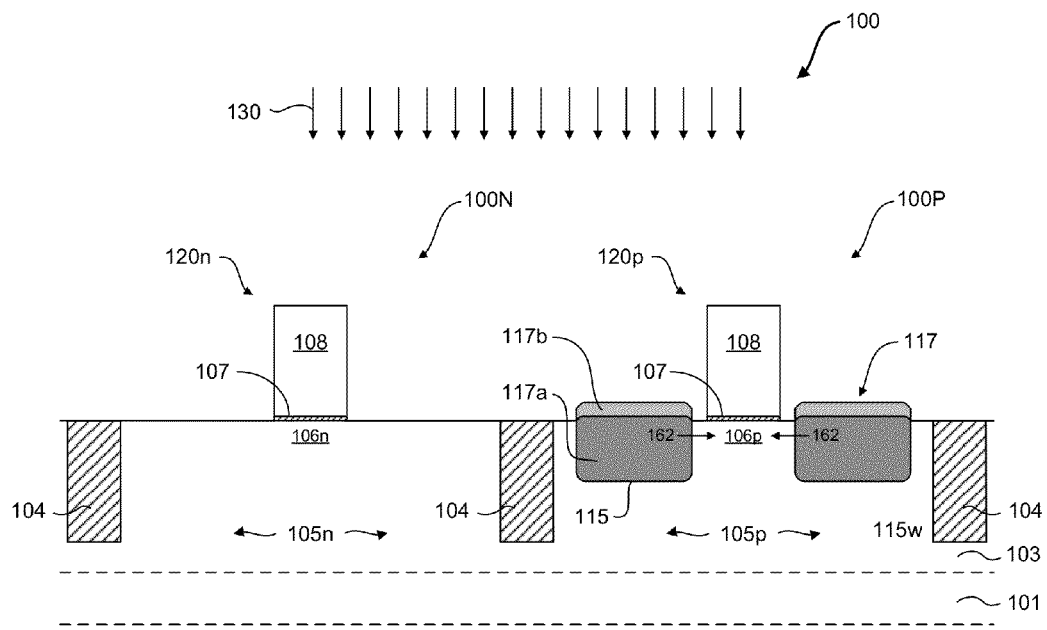
Figure 1D:
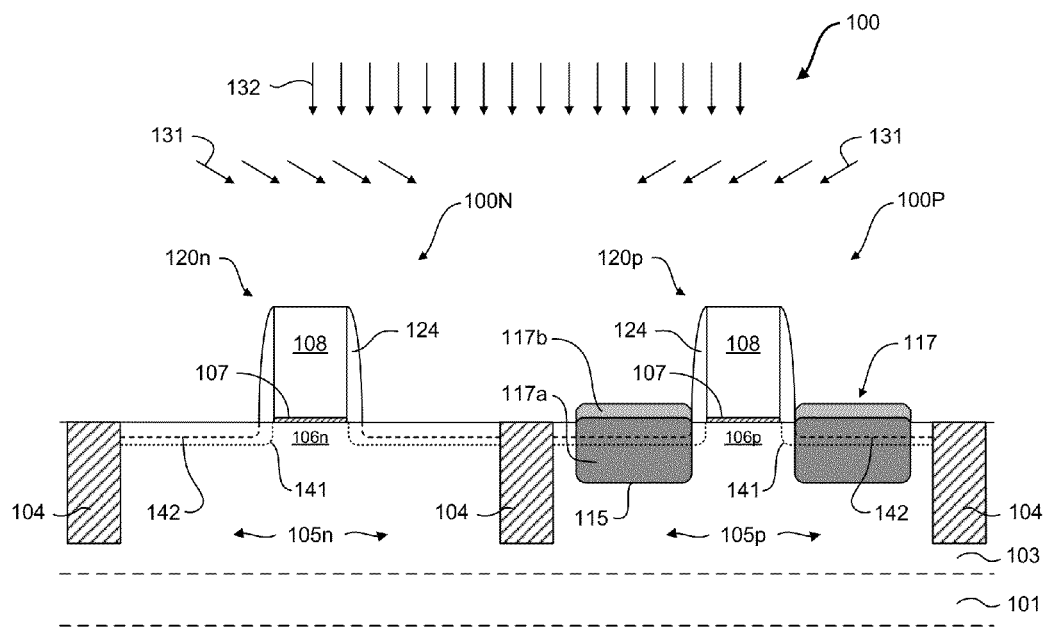
Figure 1E:
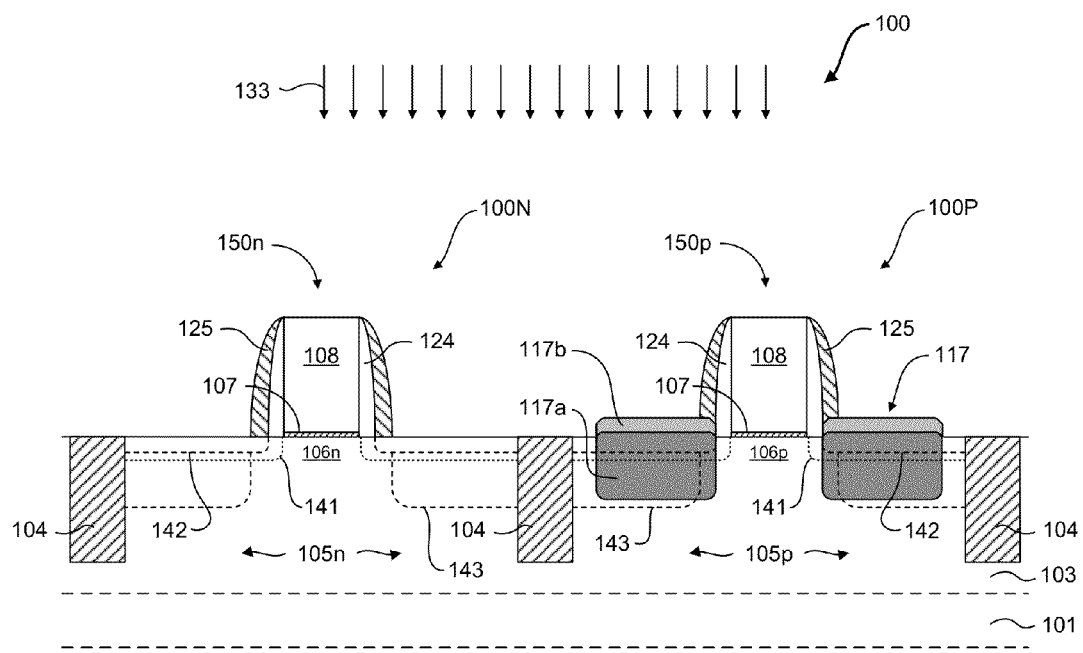
Figure 1F:
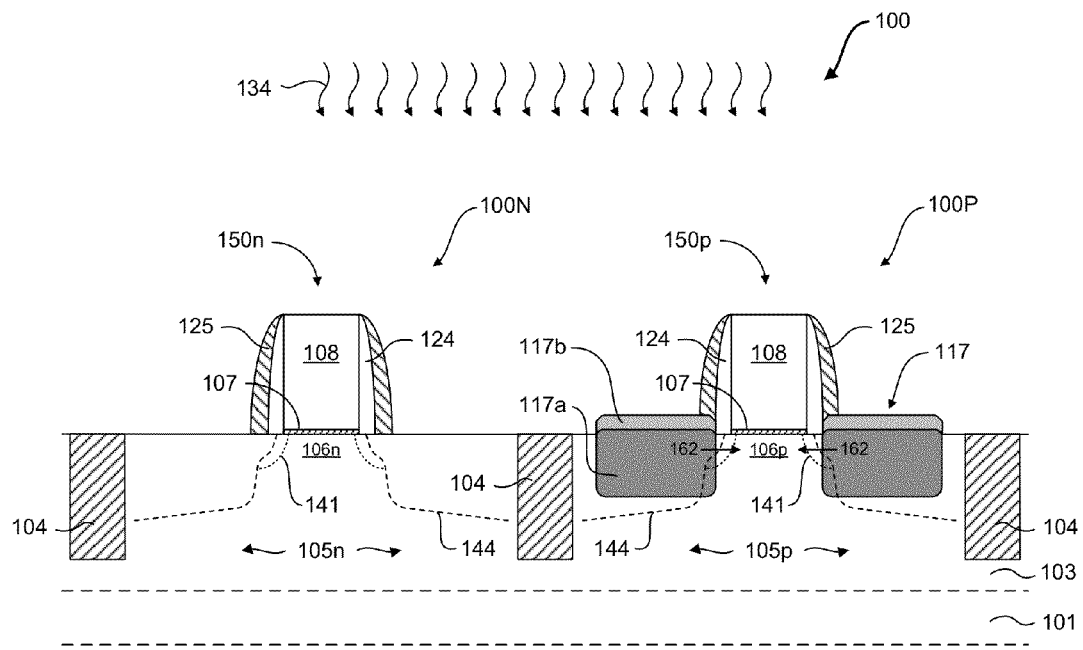

As previously described with respect to FIG. 1b above, the epitaxially deposited SiGe semiconductor material of the first layer 317a will generally adopt a lattice structure that is substantially the same as that of the silicon material of the semiconductor layer 303. Accordingly, the first layer 317a may be formed in the cavities 315 with a lattice structure that is substantially in a restrained state, thereby inducing a degree of compressive stress in the channel region 306p.

In some embodiments of the present disclosure, the first deposition ambient 374 may also be adjusted so as to include an appropriate concentration of P-type dopant atoms, such as boron and/or boron difluoride, thereby facilitating an in situ P-type doping of the first layer 317a. Furthermore, in certain embodiments, the concentration of P-type dopant atoms in the first deposition ambient 374 may be adjusted so that the as-deposited dopant concentration in the first layer 317a is relatively low, thereby substantially minimizing the possibility that any dopant diffusion may occur into the channel region 306p during any subsequent heating treating processes. Accordingly, in at least some embodiments, the concentration of P-type dopants in the first layer 317a may be established in the range of approximately $1\text{-}5e^{19}$ ions/cm$^3$, whereas in certain embodiments the concentration of P-type dopants may be approximately $1\text{-}2e^{19}$ ions/cm$^3$.

In certain embodiments, the first layer 317a of stressed SiGe semiconductor material may be formed having a thickness that ranges from 15-20 nm, although other thicknesses may also be used. Furthermore, since the first layer 317a is epitaxially deposited, it may typically be formed in a substantially conformal manner, thereby resulting in a substantially "U-shaped" material layer, as shown in FIG. 3f, thereby leaving partial cavity openings 315o.

Next, as shown in FIG. 3g, the illustrative semiconductor device 300 of FIG. 3f is exposed to a second deposition ambient 375 designed to epitaxially deposit a second layer 317b of a stressed silicon-containing semiconductor material in the partial cavity openings 315o (see, FIG. 3f), above the first layer 317a. As with the first layer 317a, in certain embodiments the second layer 317b may also be made up of a SiGe semiconductor material that is also adapted impose a compressive stress on the channel region 306p. Additionally, in some embodiments, the germanium content in the second layer 317b may be increased over that of the first layer 317a, thereby resulting in a higher level of inherent compressive stress in the second layer 317b. In such embodiments, the first layer 317a may be considered to have an "intermediate" stress level, as compared to the "high" stress level of the second layer 317b, and the substantially unstressed semiconductor layer 303. Accordingly, the first layer 317a may act as a sort of "stress buffer" region, thereby reducing the likelihood that severe stress-induced dislocation defects may occur as a result abrupt changes in inherent stress levels, a situation that could potentially release or reduce the desired level of stress in the channel region 306p.

In some illustrative embodiments, the higher germanium content of the second layer 317b may be, for example, in the range of 32-40% by weight, wherein in at least one embodiment, the germanium content is approximately 35% by weight. In such embodiments, the ratio of gaseous silicon and gaseous germanium used in the second deposition ambient 375 may be adjusted as necessary from that used in the first deposition ambient 374, thereby resulting in the above-noted higher germanium content in the second layer 317b. Furthermore, the second deposition ambient 375 may also be adjusted to include P-type dopant atoms so as to facilitate the in situ doping of the second layer 317b. It should be appreciated that, due to the use of in situ doping, a higher germanium content can generally be incorporated substitutionally in a given layer of SiGe semiconductor material. Therefore, in at least some illustrative embodiments, the germanium concentration may be higher, as may be required for a particular device design. As noted above, they higher germanium content may therefore increases the inherent stresses in the lattice structure of an epitaxially formed SiGe material layer, such as the second layer 317b, which may therefore lead to higher hole mobility in the channel region 306p.

Furthermore, in certain embodiments, the concentration of P-type dopant atoms in the second deposition ambient 375 may be adjusted so that the as-deposited dopant concentration in the second layer 317b is substantially higher than the dopant concentration in the first layer 317a, thereby enabling a lower overall sheet resistance in the active area 305p. In at least some embodiments, the concentration of P-type dopants in the second layer 317b may be up to an order of magnitude, or approximately 10 times, greater than in the first layer 317a. For example, in certain embodiments, the dopant concentration in the second layer 317b may be on the order of approximately 1-5e$^{20}$ ions/cm$^3$, whereas in at least some embodiments, the dopant concentration may be approximately 1-2e$^{20}$ ions/cm$^3$. Accordingly, the substantially lower (e.g., 10×) dopant concentration in the first layer 317a may therefore act as a sort of "dopant buffer" region, which may serve to substantially prevent any dopants from diffusing from the higher concentration level of the second layer 317b to the channel region 306p.

In certain embodiments, the second layer 317b may be formed so as to substantially completely fill the partial cavity openings 315o—i.e., to a level that is substantially even with the interface of the gate insulation layer 307 and the channel region 306p. However, in other illustrative embodiments, the second layer 317b may be formed so as to either underfill or overfill the partial cavity openings 315o, depending in some cases on the desired stress level in the channel region 306p, and/or the device processing requirements.

FIG. 3h schematically illustrates the semiconductor device 300 of FIG. 3g in a further stage of manufacturing, wherein the device 300 is exposed to a third deposition ambient 376. In some embodiments, the third deposition ambient 376 may be designed so as to epitaxially form a third layer 317c of semiconductor material above the first and second layers 317a, 317b, and so as to substantially complete the first embedded stressor material region 317, as shown in FIG. 3h. Furthermore, in certain embodiments, the third layer 317c may be made up of a semiconductor material that is substantially silicon, which may thus avoid the "spotty nickel silicide" problems associated with forming silicide contact regions in materials that include some amount of germanium, as described above. Accordingly, the parameters used for the third deposition ambient 376 may adjusted from those used for the second deposition ambient 375 so as to substantially eliminate gaseous germanium.

Additionally, the deposition ambient 376 may also be adjusted to include P-type dopant atoms as described above, so as to perform an in situ doping of the third layer 317c. In at least some embodiments, the as-deposited concentration of P-type dopants in the third layer 317c may also be substantially greater than the dopant concentration of the first layer 317a, however, in at least one embodiment it may be the same as or even slightly less than that of the second layer 317b. For example, in certain embodiments, the dopant concentration in the third layer 317c may be on the order of approximately 1e$^{20}$ ions/cm$^3$, although other concentrations may also be used.

In some embodiments, the completed embedded stressor material regions 317 may be formed to a height 317h that substantially overfills the cavities 315—i.e., wherein the upper surfaces of the embedded stressor material regions 317 extend to a level above that of the interface between the gate insulation layer 307 and the channel region 306p, as shown in FIG. 3h. For example, in certain illustrative embodiments, the height 317h may extend above the interface between the gate insulation layer 307 and channel region 306p by as much as approximately 15-20 nm. In other illustrative embodiments, the embedded stressor material regions 317 may be formed to a height 317h that is substantially flush or even with the interface between the gate insulation layer 307 and channel region 306p, whereas in still other embodiments, the cavities 315 may be underfilled by the embedded stressor material regions 317.

Accordingly, the completed embedded stressor material regions 317 may therefore induce a compressive stress (indicated by arrows 362) in the channel region 306p, as shown in FIG. 3h. The magnitude of the compressive stress 362 may be adjusted by manipulating any one of several design parameters, including but not limited to the thickness 314t of the sidewall spacers 314s, the shape, depth 315d and width 315w of the cavities 315, the relative thicknesses and germanium concentrations of the first and second stressed material layers 317a, 317b, etc.

After the third layer 317c has been epitaxially deposited and the first embedded stressor material region 317 has been completely formed as described above, the illustrative semiconductor device 300 of FIG. 3h may then be exposed to an etch process that is adapted to selectively remove the sidewall spacers 314s and the remaining portions of the spacer layer—i.e., the hardmask layer—314, relative to the underlying liner layer 316. Furthermore, in at least some embodiments, the etch process may also be adapted to selectively remove the second cap layer 312 from above the PMOS gate electrode structure 320p, relative to the underlying second liner layer 311. For example, in those illustrative embodiments of the present disclosure where the sidewall spacers 314s, the spacer layer 314, and the second cap layer 312 are each made up of a silicon nitride material and the liner layer 316 comprises a silicon dioxide material, an isotropic etch process that is selective to oxide, such as a hot phosphoric acid etch and the like, may be performed so as to strip the nitride elements.

FIG. 3i schematically illustrates the semiconductor device 300 after completion of the nitride stripping process described above. As shown in therein, a second spacer layer 313 may then be formed above both device regions 300N and 300P of the device 300. As with the spacer layer 314, the second spacer layer 313 may be made up of any one of several suitable etch selective materials, such as, for example, silicon nitride and the like. In certain embodiments, the second spacer layer 313 may be formed by performing a suitably designed deposition process 377, such as, for example, a CVD process and the like, that is adapted to deposit a substantially conformal material layer above the active areas 305n, 305p and the gate electrode structures 320n, 320p. Furthermore, the thickness of the second spacer layer 313 may be adjusted as necessary to establish the proximity of cavities 318 (see, FIG. 3k) that will be formed adjacent to the NMOS gate electrode structure 320n and the channel region 306n during a later manufacturing stage. For example, in some embodiments, the thickness of the second spacer layer 313 may range from approximately 5-20 nm, although other thickness may also be used, depending on the desired level of stress to be induced in the channel region 306n.

FIG. 3j schematically illustrates the semiconductor device 300 of FIG. 3i in a further advanced stage of manufacturing, after an etch mask 327 has been formed above the device 300 and patterned so as to expose at least a portion of the second spacer layer 313 that is formed above the NMOS device region 300N. As shown in FIG. 3j, in some embodiments the etch mask 327 covers the PMOS device region 300P, as well as some portions of the NMOS device region 300N. Thereafter, the device 300 may be subjected to a suitably designed etch process 378, such as an anisotropic reactive ion etch (RIE) process and the like, that is adapted to selectively remove the exposed horizontal portions of the second spacer layer 313 from above the liner layer 316 in the NMOS device region 300N, and to form sidewall spacers 313s adjacent to the sidewalls of the gate electrode structure 320n. Accordingly, an opening 313o may be formed in the second spacer layer 313 on either side of the gate electrode structure 320n, and the corresponding width 313w of the opening 313o may be determined by the thickness 313t of the sidewall spacers 313s, relative to the sidewalls 327s of the etch mask 327, as shown in FIG. 3j.

FIG. 3k schematically illustrates the semiconductor device 300 of FIG. 3j during a subsequent manufacturing stage, wherein the etch mask 327 has be removed from above the semiconductor device 300, and a further etch process 379 may be performed so as to form cavities 318 in the active area 305n, adjacent to and on either side of the gate electrode structure 320n. In certain illustrative embodiments, the cavities 318 may have a substantially "U-shaped" configuration as shown in FIG. 3k, or they may have a substantially "-shaped" configuration as previously described with respect to the cavities 315 above, and as indicated by lines 318s. Furthermore, in at least some embodiments of the present disclosure, the techniques and parameters used to form the cavities 318 may be substantially similar to those used to form the cavities 315 in the active area 305p, and accordingly will not be described here in any further detail. After the cavities 318 have been formed in the active area 305n, an additional pre-cleaning step may be performed so as to clean the exposed surfaces of the cavities 318, and to remove exposed portions of the oxide liner layer 316, such as the pre-cleaning step described above with respect to the cavities 315 in the PMOS device region 300P.

FIG. 3l shows the illustrative semiconductor device 300 of FIG. 3k in a further advanced manufacturing stage, after completion of the additional pre-cleaning step described above. The device 300 may then be exposed to a fourth deposition ambient 380 that is designed to epitaxially deposit a fourth layer 319a of a stressed silicon-containing semiconductor material in the cavities 318 that are formed in the active area 305n of the NMOS device region 300N. In some illustrative embodiments, the deposition ambient 380 may be based on any one of several recipes well known to those having skill in the art, such as, for example, silicon tetrachloride ($SiCl_4$), silane ($SiH_4$), dichlorosilane ($SiH_2Cl_2$), and the like, which may act as a source of silicon. Furthermore, in some illustrative embodiments—for example, when the epitaxially deposited fourth layer 319a may substantially comprise silicon-carbon (Si:C)—the deposition ambient 380 may be adjusted to comprise carbon atoms, such that the fourth layer 319a may include silicon, with carbon present in the range of approximately 1-3% by weight. In at least one embodiment, the Si:C material of the fourth layer 319a may be made up of approximately 2% carbon by weight.

As may be appreciated by those skilled in the art, the epitaxially deposited Si:C semiconductor material of the fourth layer 319a will generally adopt a lattice structure that is substantially the same as that of the silicon material of the semiconductor layer 303 in the NMOS device region 300N. Accordingly, the fourth layer 319a may be formed in the cavities 318 with a lattice structure that is substantially in a restrained state. However, unlike the germanium atoms of the SiGe material formed in the cavities 315 in the PMOS active area 305p, the covalent radius of carbon atoms is comparatively smaller than that of silicon atoms. Accordingly, the restrained lattice structure of the Si:C material making up the fourth layer 319a may tend to induce a degree of tensile stress in the channel region 306n, as indicated by arrows 361 in FIG. 3m.

In certain embodiments, the fourth deposition ambient 380 may also be adjusted so as to include an appropriate concentration of N-type dopant atoms, such as phosphorous and/or arsenic and the like, thereby facilitating an in situ N-type doping of the fourth layer 319a. Accordingly, in at least some embodiments, the concentration of N-type dopant atoms in the first deposition ambient 380 may be adjusted so that the as-deposited dopant concentration in the fourth layer 319a may be established in the range of approximately $2-6e^{20}$ ions/cm$^3$, whereas in at least one embodiment the dopant concentration may be approximately $5e^{20}$ ions/cm$^3$.

Furthermore, in some illustrative embodiments, the fourth layer 319a may be formed so as to substantially completely fill the cavities 318—i.e., to a level that is substantially flush or even with the interface of the gate insulation layer 307 and the channel region 306n. However, in other illustrative embodiments, the fourth layer 319a may be formed so as to either underfill or overfill the cavities 318, depending in some cases on the desired stress level in the channel region 306n, and/or the device processing requirements.

FIG. 3m schematically illustrates the semiconductor device 300 of FIG. 3l in yet a further advanced stage of manufacturing, wherein the device 300 is exposed to a fifth deposition ambient 381. In some embodiments, the fifth deposition ambient 381 may be designed so as to epitaxially form a fifth layer 319b of semiconductor material above the fourth layer 319a, and so as to substantially complete the second embedded stressor material regions 319, as shown in FIG. 3m. Furthermore, in certain embodiments, the fifth layer 319b may be made up of a semiconductor material that is substantially silicon, which may thus tend to avoid the problem of increased sheet resistance that is sometime associated with forming nickel silicide contacts in material regions that comprise silicon-carbon. Accordingly, the fourth deposition ambient 380 previously used to form the Si:C material of the fourth layer 319a may be correspondingly adjusted so as to substantially eliminate the presence of carbon atoms in the fifth deposition ambient 381. Furthermore, the deposition ambient 381 may also be adjusted to include N-type dopant atoms as described above, so as to perform an in situ N-type doping of the fifth layer 319b. In at least some embodiments, the as-deposited concentration of N-type dopants in the fifth layer 319b may be substantially the same as the dopant concentration of the fourth layer 319a, e.g., approximately $2\text{-}6e^{20}$ ions/cm$^3$, although other concentrations may also be used.

Accordingly, the completed second embedded stressor material region 319 may therefore induce a tensile stress (indicated by arrows 361) in the channel region 306n, as shown in FIG. 3m. Similar to the compressive stress 362 induced by the first embedded stressor material region 317, the magnitude of the tensile stress 361 may be adjusted by manipulating any one of several design parameters, including but not limited to the thickness 313t of the sidewall spacers 313s, the shape, depth 318d and width 318w of the cavities 318, the thickness and carbon concentration of the fourth stressed material layer 319a, etc. Furthermore, as with the first embedded stressor material region 317, a height 319h of the second embedded stressor material region 319 may extend to a level that his higher than, even or flush with, or lower than an interface between the gate insulation layer 307 and the channel region 305n.

After the epitaxially deposited second embedded stressor material region 319 has been completely formed as described above, the illustrative semiconductor device 300 of FIG. 3m may then be exposed to an etch process that is adapted to selectively remove the sidewall spacers 313s and the remaining portions of the spacer layer 313, relative to the underlying liner layer 316. Furthermore, in at least some embodiments, the etch process may also be adapted to selectively remove the second cap layer 312 from above the NMOS gate electrode structure 320n, relative to the underlying second liner layer 311. For example, in those illustrative embodiments of the present disclosure where the sidewall spacers 314s, the spacer layer 314, and the second cap layer 312 are each made up of a silicon nitride material and the liner layer 316 comprises a silicon dioxide material, an isotropic etch process that is selective to oxide, such as a hot phosphoric acid etch and the like, may be performed so as to strip the nitride elements.

FIG. 3n schematically depicts the illustrative semiconductor device 300 of FIG. 3m in a further stage of manufacturing, after completion of the above-described steps. As shown in FIG. 3n, further spacer elements 323 may be formed adjacent to the sidewalls of the NMOS and PMOS gate electrode structures 320n and 320p, respectively, based on material deposition and etching techniques well known in the art. A thickness 323t of the further spacer elements 323 may set as required to establish the position of silicide contact regions relative to the gate electrode structures 320n, 320p that will be formed in a later processing step. In some illustrative embodiments, the spacer thickness 323t may range between approximately 25 nm and 40 nm, although other spacer thicknesses may also be used.

Also as shown in FIG. 3n, the semiconductor device 300 may be exposed to a heat treating process 334 that is adapted to activate the in situ deposited P-type and N-type dopants of the first and second embedded stressor material regions 317 and 319, respectively, while substantially avoiding diffusion of the dopants into the respective channel regions 306p and 306n. For example, the heat treating process 334 may be a substantially diffusionless annealing process, e.g., a UFA process and the like as previously described, which, in certain embodiments may be performed for less than 100 milliseconds, such as for 10 milliseconds or even less. Furthermore, the heat treating process 334 may also serve to activate dopants and repair lattice damage in the halo and/or shallow extension implant regions 341, 342 in those illustrative embodiments of the present disclosure where an optional heat treating process may not have been previously performed (see, e.g., FIG. 3b, as described above).

As may be appreciated by those having skill in the art, Si:C semiconductor materials are typically formed in a metastable state due to the nature of the covalent bonds between carbon and silicon, and as such are generally considered to be less thermally stable than the more robust SiGe semiconductor materials. As such, stressed Si:C materials may undergo a significant amount of stress relaxation during lengthier heat treatments processes, such as the RTA process previously described with respect to the prior art device illustrated in FIGS. 1a-1f above. Accordingly, should a typical RTA process be performed so as to activate the N-type dopants in the embedded stressor material regions 319 formed in the NMOS active area 305n, the Si:C material of those stressor regions 319 may be "destabilized," which could potentially lead to a significant stress relaxation of the Si:C material, and the corresponding tensile stress induced in the channel region 306n. However, such detrimental stress relaxation generally does not have time to occur during a typical substantially diffusionless annealing process, such as the UFA heat treating process 334 described above.

As a result of the dopant activation that occurs during the heat treating process 334, source and drain regions 344 of the NMOS and PMOS transistor elements 350n and 350p, respectively (schematically depicted in FIG. 3n) may be established and corresponding P-N junctions created in the active areas 305n and 305p of the device regions 300N and 300P, respectively. Furthermore, it should be appreciated that, unlike the prior art device 100 described above, dopant diffusion may be substantially avoided, such that the activated dopants are substantially confined to the implanted regions 341, 342, and the in situ doped first and second embedded stressor material regions 317, 319.

After completion of the heat treating process 334, a further pre-cleaning process may be performed so as to prepare the surfaces of the source and drain regions 344 for silicidation. In some embodiments, the further pre-cleaning process may also be adapted to selectively remove the second oxide liners 311 of the gate electrode structures 320n, 320p relative to the first nitride cap layers 310, and in some embodiments may also be performed so as to remove portions of the oxide liner layer 316 on the sidewalls of the cap layers 310, as illustrated in FIG. 3o. Thereafter, a silicidation process may be performed so as to form silicide contact regions 345 in the upper portions of the drain and source regions 344—i.e., in the substantially silicon material of the third material layer 317c of the first embedded stressor material region 317 and the fifth material layer 319b of the second embedded stressor material region 319, also as shown in FIG. 3o. The silicide contact regions 345 may comprise any one of several well-known refractory-metal based silicide materials, such as nickel silicide or cobalt silicide and the like, and may be formed by using techniques and processing steps that are also well known in the art, such as depositing a refractory metal layer above the device 300, performing a thermal treatment to cause a chemical reaction between the refractory metal layer and the underlying silicon-based semiconductor materials, and the like.

Furthermore, is should be appreciated that in those illustrative embodiments of the present disclosure wherein a conventional polySiON gate electrode architecture is contemplated, a suitably designed etch sequence may be performed so as to remove the first cap layers 310 and first liner layers 309 from above the gate electrode structures 320n, 320p, thereby exposing an upper surface the gate electrodes 308. This etch step may be performed prior to performing silicidation process described above, so that additional silicide contract regions (not shown) may also be formed in the upper portion of each gate electrode 308.

Thereafter, additional device processing steps may be performed so as to complete the device 300, such as form an interlayer dielectric material (not shown) above the NMOS and PMOS device regions 300N and 300P, forming contact vias (not shown) to the contact regions 345 of the transistor elements 350n and 350p, and thereafter forming the back-end-of-line (BEOL) metallization layers (not shown), including the conductive lines and vias (not shown) that make up the overall electronic circuit of the semiconductor device 300.

FIGS. 3p-3t schematically depict the semiconductor device 300 of FIG. 3o in further illustrative processing steps, such as, for example, when an HK/MG gate electrode architecture is used based on a "gate last," or "replacement gate," manufacturing technique, and will hereinafter be briefly described.

As shown in FIG. 3p, an interlayer dielectric material layer 328a may be formed above the NMOS and PMOS device regions 300N, 300P, including the gate electrode structures 320n, 320p, which may hereinafter be referred to as "dummy" gate electrodes 320n, 320p. The interlayer dielectric material layer 328a may include one or more dielectric layers, depending on the overall device processing requirements. In some illustrative embodiments, the interlayer dielectric material layer 328a may be made up of one or more of several suitable insulating dielectric materials, as may be well known in the art. For example, in certain embodiments, the interlayer dielectric material layer 328a may comprise, for example, silicon dioxide, which may be deposited using a suitable deposition process, such as CVD based on TEOS (tetraethyl orthosilicate) and the like.

Thereafter, as shown in FIG. 3q, a planarization process 382, such as, for example, a chemical mechanical polishing (CMP) process and the like, may be performed so as to remove the first cap layers 310 and first liner layers 309 from above the dummy gate electrode structures 320n, 320p, so as to thereby expose the gate electrodes 308, which may hereinafter be referred to as "dummy" gate electrodes 308. Then, as shown in FIG. 3r, an etch process 383 may be performed so as to selectively remove the dummy gate electrodes 308 relative to the oxide materials of the liner layer 316 and the gate insulation layers 307, which may hereinafter be referred to as "dummy" gate insulation layers 307, using any one of several suitably designed isotropic etch recipes, such as a nitric/hydrofluoric acid etch, and the like. In certain illustrative embodiments, the etch chemistry of the etch process 383 may then be adjusted so as to selectively remove the dummy gate insulation layers 307, as well as the remaining sidewall portions of the oxide liner layer 316 relative to the nitride material of the further spacer elements 323. After completion of the etch process 383, the dummy gate electrode structures 320n, 320p may be completely removed, leaving an opening 308o between the further spacer elements 323.

FIG. 3s shows the illustrative semiconductor device 300 of FIG. 3r after a plurality of additional manufacturing steps have been performed, thereby forming the HK/MG replacement gate electrode structures 360n and 360p, and corresponding transistor elements 370n and 370p, respectively. The replacement gate electrode structures 360n, 360p of FIG. 3s may each include, for example, a gate insulation layer 347 made of a suitable high-k dielectric material, such as tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like. Moreover, in certain embodiments, the specific material and/or materials making up the gate insulation layer 347 of the respective NMOS and PMOS replacement gate electrode structure 360n, 360p may be substantially different from one another.

As shown in FIG. 3s, the replacement gate electrode structure 360n may also include an N-metal material layer 348n, whereas the replacement gate electrode structure 360p may include a P-metal work function material layer 348p, each of which may be formed above the respective gate insulation layers 347. Depending on the desired work function and threshold voltage requirements of the transistor elements 370n, 370p, the N-metal material layer 348n and the P-metal work function material layer 348p may each comprise, for example, one or more of several metal gate materials well known in the art, such as titanium nitride (TiN), titanium-aluminum (TiAl), titanium aluminum nitride (TiAlN), titanium silicon nitride (TiSiN) and the like, as well as combinations thereof. Thereafter, each of the replacement gate electrode structures 360n, 360p may be completed by forming a final layer of conductive metal 349, such as, for example, titanium nitride and the like, above the respective N-metal and P-metal material layers 348n, 348p. In some illustrative embodiments, a thin layer of aluminum (not shown) may be formed on the N-metal and P-metal layers 348n, 348p so as to facilitate the formation of the final layer of conductive metal 349. Furthermore, the semiconductor device 300 may be exposed to a planarization process, such as a CMP process and the like, so as to remove excess material of the layer of conductive metal 349, and to create a planarized upper surface 328s suitable for further device processing.

FIG. 3t shows the illustrative semiconductor device 300 of FIG. 3s in a further advanced manufacturing stage. As shown in FIG. 3t, a further interlayer dielectric material layer 328b has been formed above the replacement gate electrode structures 360n, 360p and the dielectric material layer 328a. Furthermore, a plurality of contact elements 361 have been formed to electrically connect the silicide contact regions 345 and the gate electrode structures replacement 360n, 360p of the transistor elements 370n, 370p to a metallization system (not shown) of the semiconductor device 300 that may be formed during later processing steps.

As a result of the presently disclosed subject matter, in some illustrative embodiments, a double sandwich gate cap layer stack (e.g., SiO liner/SiN cap/SiO liner/SiN cap) may be used in order to enable the formation of dual embedded source/drain stressor material regions based on SiGe and Si:C epitaxial material deposition, while, in some illustrative embodiments, simultaneously employing an HK/MG "gate last" or "replacement gate" flow technique. Accordingly, it may be possible to utilize these highly effective local stressor regions for maximum carrier mobility enhancement and drive current increase in both NMOS and PMOS devices, while at the same time reducing device off-current, and further incorporating the scaling benefits of the HK/MG gate architecture approach. Furthermore, the use of the "replacement gate" approach may further enhance any local stresses that may be induced in the channel regions by the embedded stressor material regions by as much as 50%, since the forces (and associated stresses) on the channel regions that may be caused by the "dummy" polySiON gate electrode structure will be removed prior to HK/MG gate electrode fabrication. Moreover, the HK/MG scheme may also provide additional control over gate leakage current, and allow further scaling of the gate length due to the improved control of short channel effects.

Additionally, the in situ doping and substantially diffusion-less annealing approach of the present disclosure may lead to reduced parametric variations in the devices, while further improving short channel behavior. Furthermore, it should be appreciated that, as a result of the non-equilibrium growth conditions of the in situ doped epitaxially formed material layers in the active areas of the devices, the concentration of P-type and N-type dopants in the embedded stressor material regions may be substantially higher than what can be normally achieved from a corresponding ion implantation process. These higher dopant concentrations, when activated, may tend to significantly reduce the sheet resistance of the shallow extension regions, as well as that of the deep source/drain regions formed in the device active areas. Moreover, since deep ion implantation processes are not performed in conjunction with the process flows described herein, it is possible to avoid the inadvertent relaxation of any dislocation defections that may have been formed in the embedded stressor material regions, which can sometimes be triggered by the implantation energy associated with deep ion implantation processes. Therefore, the unique combination of the processing steps disclosed herein may result in a high-performance low-power CMOS technology capability for the 20 nm technology node and beyond.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a plurality of first cavities in a first active area of a PMOS device region of a semiconductor substrate, wherein said first cavities are formed between a first gate electrode structure formed above said first active area and an isolation structure defining said first active area;
    performing a first epitaxial deposition process to form in situ doped first embedded material regions comprising a first type of semiconductor material in said plurality of first cavities, wherein forming said in situ doped first embedded material regions comprises:
        forming a first semiconductor layer in said plurality of first cavities, wherein said first semiconductor layer covers substantially an entirety of exposed sidewall and bottom surfaces of each of said plurality of first cavities so as to define a plurality of reduced-size cavities in said PMOS device region; and
        forming a second semiconductor layer on said first semiconductor layer in said plurality of reduced-sized cavities;
    forming a plurality of second cavities in a second active area of an NMOS device region of said semiconductor substrate, wherein said second cavities are formed between a second gate electrode structure formed above said second active area and an isolation structure defining said second active area;
    performing a second epitaxial deposition process to form second embedded material regions comprising a second type of semiconductor material in said plurality of second cavities, wherein said second type of semiconductor material is different than said first type of semiconductor material;
    epitaxially forming an in situ doped third semiconductor layer on exposed upper surfaces of each of said first and second semiconductor layers, said third semiconductor layer comprising a third type of semiconductor material that is different than said first and second types of semiconductor material; and
    performing a single heat treating process to activate dopants in said in situ doped first and second embedded material regions.

2. The method of claim 1, wherein said first embedded material region has a first type of intrinsic stress and said second embedded material region has a second type of intrinsic stress that is of an opposite type from said first type.

3. The method of claim 2, wherein said first type of semiconductor material comprises a silicon-germanium material, said second type of semiconductor material comprises a silicon-carbon material, said first type of intrinsic stress is a compressive stress, and said second type of intrinsic stress is a tensile stress.

4. The method of claim 3, wherein performing said first epitaxial deposition process comprises epitaxially forming said first semiconductor layer with a first dopant concentration of P-type dopant material and epitaxially forming said second semiconductor layer with a second dopant concentration of P-type dopant material that is greater than said first dopant concentration of P-type dopant material.

5. The method of claim 4, wherein said second dopant concentration of P-type dopant material is approximately 10 times greater than said first dopant concentration of P-type dopant material.

6. The method of claim 4, wherein said first dopant concentration of P-type dopant material ranges from approximately $1\text{-}5e^{19}$ ions/cm$^3$, and said second dopant concentration of P-type dopant material ranges from approximately $1\text{-}5e^{20}$ ions/cm$^3$.

7. The method of claim 4, wherein performing said first epitaxial deposition process comprises substantially filling said plurality of reduced-size cavities.

8. The method of claim 4, wherein said first semiconductor layer comprises a silicon-germanium material having a first germanium concentration, and said second semiconductor layer comprises a silicon-germanium material having a second germanium concentration that is greater than said first germanium concentration.

9. The method of claim 8, wherein said first germanium concentration is less than approximately 25% by weight and said second germanium concentration is greater than approximately 30% by weight.

10. The method of claim 8, wherein said third type of semiconductor material is a substantially germanium-free silicon-based material and has a third dopant concentration of P-type dopant material that is greater than said first dopant concentration of P-type dopant material.

11. The method of claim 10, wherein said third dopant concentration of P-type dopant material is less than said second dopant concentration of P-type dopant material.

12. The method of claim 1, wherein performing said second epitaxial deposition process comprises:
epitaxially forming a fourth semiconductor layer on exposed surfaces of each of said plurality of second cavities, said fourth semiconductor layer having a fourth dopant concentration of N-type dopant material; and
epitaxially forming a fifth semiconductor layer on said fifth semiconductor layer, said fifth semiconductor layer having a fifth dopant concentration of N-type dopant material.

13. The method of claim 12, wherein said fourth dopant concentration of N-type dopant material is approximately the same as said fifth dopant concentration of N-type dopant material.

14. The method of claim 12, wherein said fourth dopant concentration of N-type dopant material ranges from approximately $2\text{-}6e^{20}$ ions/cm$^3$, and said fifth dopant concentration of N-type dopant material ranges from approximately $2\text{-}6e^{20}$ ions/cm$^3$.

15. The method of claim 12, wherein epitaxially forming said fourth semiconductor layer comprises substantially filling said plurality of second cavities.

16. The method of claim 12, wherein said fourth semiconductor layer comprises a silicon-carbon material having a carbon concentration in the range of approximately 1-3% by weight, and said fifth semiconductor layer comprises a substantially carbon-free silicon-based material.

17. The method of claim 1, wherein performing said heat treating process comprises performing a substantially diffusionless annealing process.

18. The method of claim 17, wherein performing said substantially diffusionless annealing process comprises performing an ultra-fast annealing process at a temperature that is greater than approximately 1200° C. for a duration that is less than approximately 10 milliseconds.

19. The method of claim 17, wherein performing said substantially diffusionless annealing process comprises performing one of a laser spike anneal and a flash lamp anneal.

20. The method of claim 1, further comprising forming drain and source implant extension regions in said first and second active areas and adjacent to said first and second gate electrode structures, respectively, prior to forming said pluralities of first and second cavities.

21. The method of claim 20, further comprising performing a substantially diffusionless annealing process to activate dopants in said drain and source implant extension regions in said first and second active areas prior to forming said pluralities of first and second cavities.

22. The method of claim 1, wherein at least one of said first and second gate electrode structures is a dummy gate electrode structure, the method further comprising removing said dummy gate electrode structure and replacing said dummy gate electrode structure with a replacement gate electrode structure comprising a high-k dielectric insulation layer and a metal gate electrode.

23. A method, comprising:
forming a gate electrode structure of a transistor element above an active area formed in a semiconductor layer of a semiconducting substrate, wherein said gate electrode structure is positioned above a channel region of said transistor element;
forming in situ doped material regions in said active area adjacent to said gate electrode structure, wherein forming said in situ doped material regions comprises:
forming a plurality of cavities in said active area, wherein said plurality of cavities are formed between said gate electrode and an isolation structure defining said active area, each of said plurality of cavities comprising an exposed bottom and an exposed sidewall surface that is laterally adjacent to said channel region;
epitaxially forming a first in situ doped layer of a first semiconductor material in each of said plurality of first cavities, said first in situ doped layer covering at least said exposed bottom and sidewall surface of each of said plurality of cavities and having a first concentration of dopant;
epitaxially forming a second in situ doped layer of a second semiconductor material on said first doped layer, said second in situ doped layer having a second concentration of dopant that is greater than said first concentration, wherein a portion of said first in situ doped layer is positioned between said second in situ doped layer and said channel region;
epitaxially forming a third in situ doped layer of a third semiconductor material on exposed upper surfaces of each of said first and second doped layers, wherein said third semiconductor material is different than said first and second semiconductor materials; and
activating said dopants in said first, second, and third in situ doped layers during a common heat treating process.

24. The method of claim 23, wherein said third in situ doped layer has a third concentration of dopant that is greater than said first concentration.

25. The method of claim 24, wherein said first and second semiconductor materials comprise silicon-germanium and said third semiconductor material is substantially silicon.

26. The method of claim 1, wherein said in situ doped third semiconductor layer is formed prior to forming said second embedded material regions.

27. The method of claim 10, further comprising performing a silicidation process to form a silicide contact region in an upper portion of said in situ doped third semiconductor layer.

* * * * *